United States Patent
Suzuki

(10) Patent No.: US 11,908,908 B2
(45) Date of Patent: Feb. 20, 2024

(54) SEMICONDUCTOR DEVICE AND MANUFACTURING METHOD THEREOF

(71) Applicant: Kioxia Corporation, Tokyo (JP)

(72) Inventor: Kazutaka Suzuki, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 246 days.

(21) Appl. No.: 17/458,009

(22) Filed: Aug. 26, 2021

(65) Prior Publication Data

US 2022/0293751 A1  Sep. 15, 2022

(30) Foreign Application Priority Data

Mar. 12, 2021 (JP) ................................. 2021-040581

(51) Int. Cl.
| | |
|---|---|
| H01L 29/417 | (2006.01) |
| H01L 21/28 | (2006.01) |
| H01L 29/423 | (2006.01) |
| H10B 41/27 | (2023.01) |
| H10B 43/27 | (2023.01) |

(52) U.S. Cl.
CPC .. H01L 29/41741 (2013.01); H01L 29/40114 (2019.08); H01L 29/40117 (2019.08); H01L 29/42356 (2013.01); H10B 41/27 (2023.02); H10B 43/27 (2023.02)

(58) Field of Classification Search
CPC ......... H01L 29/41741; H01L 29/40114; H01L 29/40117; H01L 29/42356; H10B 41/27; H10B 43/27; H10B 41/10; H10B 43/10
See application file for complete search history.

(56) References Cited

U.S. PATENT DOCUMENTS

| | | | | |
|---|---|---|---|---|
| 10,242,993 | B2* | 3/2019 | Ichinose | H10B 41/27 |
| 10,868,030 | B2* | 12/2020 | Shioda | H10B 43/27 |
| 10,991,708 | B2* | 4/2021 | Sakamoto | H10B 43/40 |
| 2014/0054675 | A1* | 2/2014 | Lee | H10B 43/27 |
| | | | | 438/269 |
| 2016/0268289 | A1* | 9/2016 | Noda | H10B 41/27 |
| 2019/0122734 | A1* | 4/2019 | Shibata | G11C 11/5642 |

(Continued)

FOREIGN PATENT DOCUMENTS

JP    2019-079885 A    5/2019

*Primary Examiner* — Shahed Ahmed
*Assistant Examiner* — Khatib A Rahman
(74) *Attorney, Agent, or Firm* — Foley & Lardner LLP

(57) ABSTRACT

A semiconductor device includes a substrate. The device includes a stacked film that includes a plurality of first electrode layers provided over the substrate and separated from each other in a first direction perpendicular to a front surface of the substrate and a plurality of second electrode layers provided over the first electrode layer and separated from each other in the first direction. The device further includes a first insulating film and a second insulating film that penetrate the plurality of first electrode layers and the plurality of second electrode layers in the first direction. The stacked film further includes a first gap portion including a first portion provided between the substrate and a lowermost layer of the plurality of first electrode layers and a second portion connected to the first portion, penetrating the plurality of first electrode layers in the first direction, between the first insulating film and the second insulating film.

16 Claims, 27 Drawing Sheets

(56) References Cited

U.S. PATENT DOCUMENTS

2020/0105782 A1* 4/2020 Guo ................. H10B 43/27
2021/0066343 A1* 3/2021 Choi ................ H10B 43/10
2022/0254792 A1* 8/2022 Kim ................. H10B 41/27

* cited by examiner

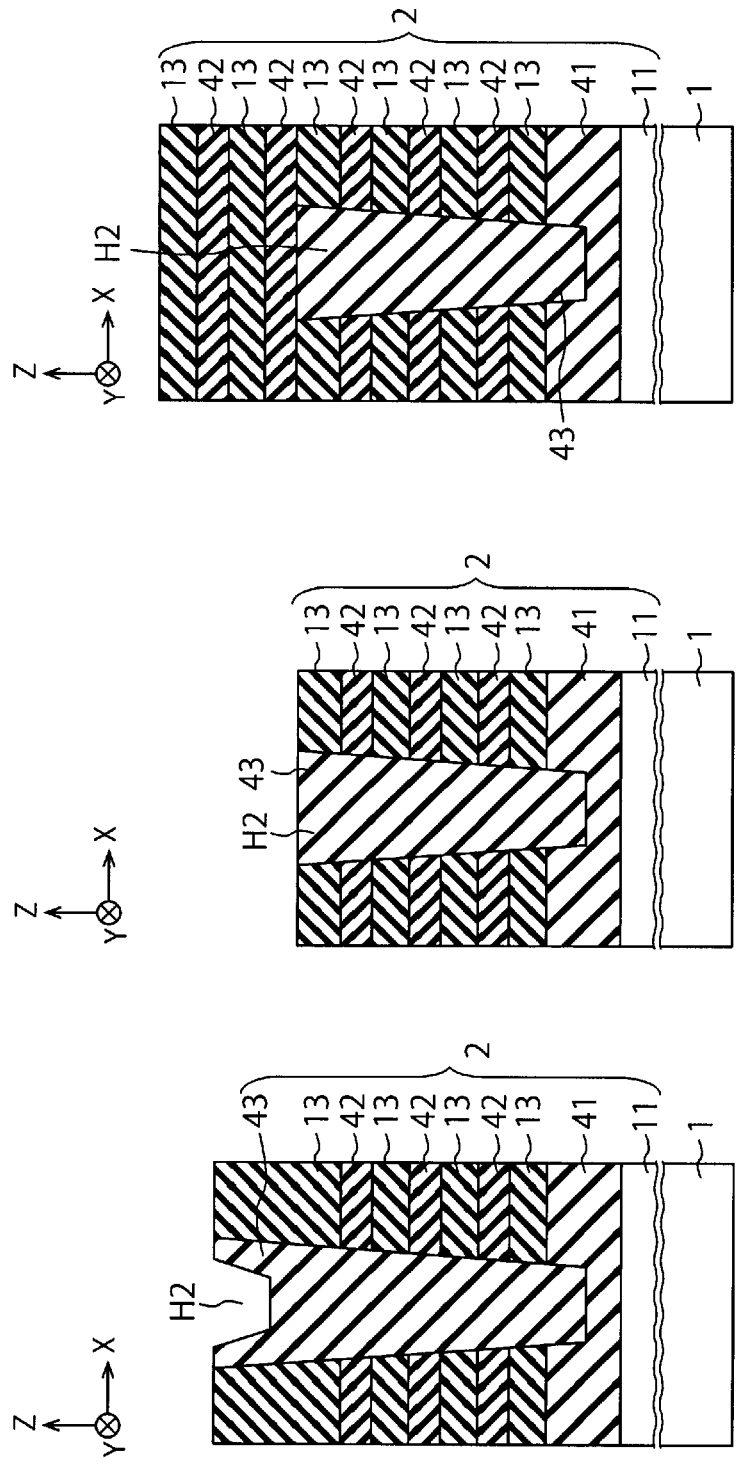

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2021-040581, filed Mar. 12, 2021, the entire contents of which are incorporated herein by reference.

FIELD

Embodiments described herein relate generally to a semiconductor device and a manufacturing method thereof.

BACKGROUND

When an electrode layer (for example, selection line) of a three-dimensional semiconductor memory is manufactured, a method of enabling easy separation of electrode layers is preferably employed.

DESCRIPTION OF THE DRAWINGS

FIGS. 14A to 14C are enlarged cross-sectional views illustrating the method of manufacturing the semiconductor device according to the first embodiment (2/2).

DETAILED DESCRIPTION

Figure 1:
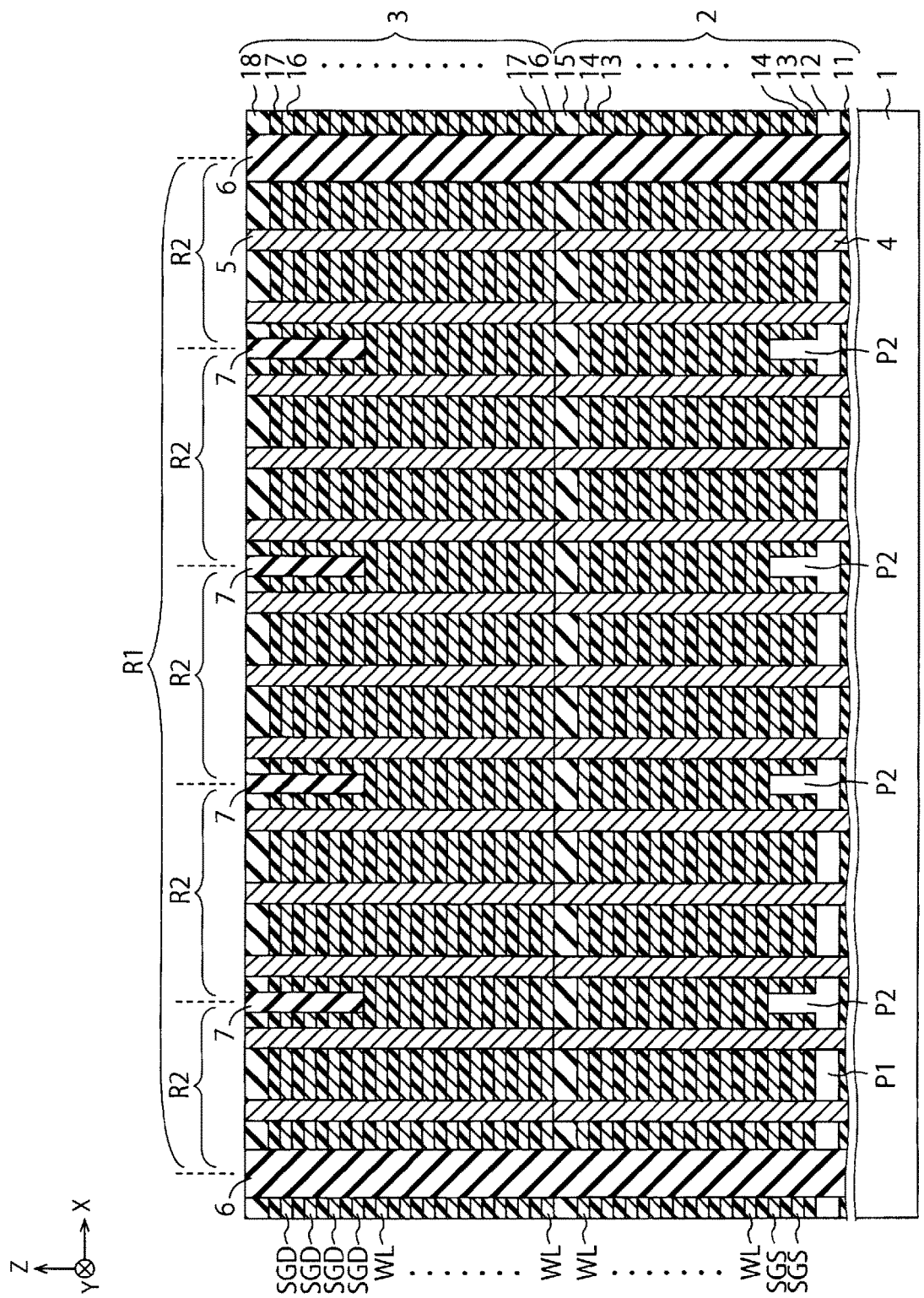
FIG. 1 is a cross-sectional view illustrating a structure of a semiconductor device according to a first embodiment.

At least one embodiment provides a semiconductor device in which electrode layers can be easily separated and a manufacturing method thereof.

In general, according to at least one embodiment, a semiconductor device includes a substrate. The device includes a stacked film that includes a plurality of first electrode layers provided over the substrate and separated from each other in a first direction perpendicular to a front surface of the substrate and a plurality of second electrode layers provided over the first electrode layer and separated from each other in the first direction. The device further includes a first insulating film and a second insulating film that penetrate the plurality of first electrode layers and the plurality of second electrode layers in the first direction, extend in a second direction intersecting to the first direction, and divide the plurality of first electrode layers and the plurality of second electrode layers in a third direction intersecting to the first direction. The stacked film further includes a first gap portion including a first portion provided between the substrate and a lowermost layer of the plurality of first electrode layers and a second portion connected to the first portion, penetrating the plurality of first electrode layers in the first direction, extending in the second direction, and dividing the plurality of first electrode layers in the third direction, between the first insulating film and the second insulating film.

Hereinafter, embodiments of the present disclosure will be described with reference to the drawings. In FIGS. 1 to 27, the same configurations are designated by the same reference numerals, and redundant description is omitted.

First Embodiment

FIG. 1 is a cross-sectional view illustrating a structure of a semiconductor device according to a first embodiment. The semiconductor device of FIG. 1 is, for example, a three-dimensional semiconductor memory.

The semiconductor device of FIG. 1 includes a substrate 1, a lower stacked film 2, an upper stacked film 3, a plurality of lower columnar portions 4, a plurality of upper columnar portions 5, a plurality of embedded insulating films 6, and a plurality of embedded insulating films 7. The lower stacked film 2 and the upper stacked film 3 are examples of stacked films. The lower columnar portions 4 and the upper columnar portions 5 are examples of columnar portions. The embedded insulating films 6 are examples of first and second insulating films.

The lower stacked film 2 includes an interlayer insulating film 11, an air gap (gap portion) 12, a plurality of insulating layers 13, a plurality of electrode layers 14, an interlayer insulating film 15, and the upper stacked film 3 includes a plurality of electrode layers 16, a plurality of insulating layers 17, and an interlayer insulating film 18. The air gap 12 includes a portion P1 and a plurality of portions P2, the electrode layers 14 includes a plurality of source-side selection lines SGS and a plurality of word lines WL, and the electrode layers 16 includes the plurality of word lines WL and a plurality of drain-side selection lines SGD. The air gap 12 is an example of a first gap portion. The portion P1 and the portions P2 are respectively examples of first and second portions. The source-side selection lines SGS, the word lines WL, and the drain-side selection lines SGD are examples of first, second, and third electrode layers, respectively.

The semiconductor device of FIG. 1 further includes one region R1 and a plurality of regions R2. The region R1, for example, corresponds to one finger of a three-dimensional semiconductor memory. However, each region R2, for example, corresponds to one page of the three-dimensional semiconductor memory. In FIG. 1, one region R1 includes five regions R2.

Hereinafter, further details of the structure of the semiconductor device of FIG. 1 are described.

The substrate 1 is, for example, a semiconductor substrate such as a silicon substrate. FIG. 1 illustrates an X direction and a Y direction that are parallel to the front surface of the substrate 1 and perpendicular to each other, and a Z direction that is perpendicular to the front surface of the substrate 1. In the present specification, the +Z direction is treated as an upward direction, and the −Z direction is treated as a downward direction. The −Z direction may or may not coincide with the direction of gravity. The Z direction is an example of a first direction, the Y direction is an example of a second direction, and the X direction is an example of a first direction. The X, Y, and Z directions intersect each other.

The lower stacked film 2 includes the interlayer insulating film 11 formed on the substrate 1, the air gap 12 formed on the interlayer insulating film 11, the plurality of insulating layers 13 and the plurality of electrode layers 14 alternately formed on the air gap 12, and the interlayer insulating film 15 formed on the insulating layers 13 and the electrode layers 14. The interlayer insulating film 11 may be directly formed on the substrate 1 and may be formed on the substrate 1 via another layer. The interlayer insulating film 11 is, for example, a silicon oxide film ($SiO_2$ film). The air gap 12 is, for example, a space filled with the air. The insulating layer 13 is, for example, an $SiO_2$ film. The electrode layer 14 is, for example, a metal layer including a TiN film (titanium nitride film) as a barrier metal layer and a W (tungsten) layer as an electrode material layer. The interlayer insulating film 15 is, for example, an $SiO_2$ film.

The electrode layer 14 includes the plurality of source-side selection lines SGS that are provided over the substrate 1 and separated from each other in the Z direction and the plurality of word lines WL that are provided over the source-side selection lines SGS and separated from each other in the Z direction. The electrode layers 14 are electrically insulated from each other by the insulating layers 13.

Between the embedded insulating films 6, the air gap 12 includes the portion P1 provided between the interlayer insulating film 11 and the insulating layer 13 and the plurality of portions P2 that are connected to the portion P1 and provided in the electrode layers 14. The portion P1 extends in the X and Y directions. However, these portions P2 are arranged in the Z direction of the portion P1 and extend in the Z and Y directions and adjacent to each other in the X direction. As illustrated in FIG. 1, the portions P2 of at least one embodiment are formed in the electrode layers 14 corresponding to the source-side selection lines SGS. Therefore, the upper portions (upper surfaces) of the portions P2 are in contact with the lower surfaces of the insulating layers 13 between the source-side selection lines SGS and the word lines WL. In addition, the side portions (side surfaces) of the portions P2 are in contact with the side surfaces of the source-side selection lines SGS and the side surfaces of the insulating layers 13 provided between the source-side selection lines SGS.

In FIG. 1, the portion P1 is formed between the substrate and the lowermost layer of the electrode layers 14 corresponding to the source-side selection lines SGS. In addition, the portions P2 penetrate the electrode layers 14 corresponding to the source-side selection lines SGS in the Z direction, extend in the Y direction, and divide the electrode layers 14 corresponding to the source-side selection lines SGS in the X direction.

The upper stacked film 3 includes the plurality of electrode layers 16 and the plurality of insulating layers 17 alternately formed on the interlayer insulating film 15 and the interlayer insulating film 18 formed on the electrode layers 16 and the insulating layers 17. The electrode layers 16 are, for example, a metal layer including a TiN film as the barrier metal layer and a W layer as the electrode material layer. The insulating layer 17 is, for example, an $SiO_2$ film. The interlayer insulating film 18 is, for example, an $SiO_2$ film.

The electrode layers 16 include the plurality of word lines WL that are provided over the word lines WL in the lower stacked film 2 and separated from each other in the Z direction and the plurality of drain-side selection lines SGD that are provided over the word lines WL in the upper stacked film 3 and separated from each other in the Z direction. The electrode layers 16 are electrically insulated from each other by the insulating layers 17.

The lower columnar portions 4 are formed in the lower stacked film 2 and have columnar shapes extending in the Z direction. As described below, the lower columnar portion 4 includes a charge storage layer and a channel semiconductor layer in the lower stacked film 2. The lower columnar portions 4 form select transistors together with the source-side selection lines SGS and form memory cell transistors (memory cells) together with the word lines WL. The lower columnar portions 4 are formed in the insulating layers 13 and the electrode layers 14 in the lower stacked film 2.

The upper columnar portions 5 are formed in the upper stacked film 3 and have columnar shapes extending in the Z direction. As described below, the upper columnar portions 5 include a charge storage layer or a channel semiconductor layer in the upper stacked film 3. The upper columnar portions 5 form memory cell transistors together with the word lines WL and form select transistors together with the drain-side selection lines SGD. The upper columnar portions 5 are formed in the electrode layers 16 and the insulating layers 17 in the upper stacked film 3. As illustrated in FIG. 1, the upper columnar portions 5 are disposed on the corresponding lower columnar portions 4 and electrically connected to the corresponding lower columnar portions 4.

The embedded insulating films 6 are formed in the lower stacked film 2 and the upper stacked film 3 and extend in the Z and Y directions. FIG. 1 illustrates two embedded insulating films 6 adjacent to each other in the X direction. The embedded insulating films 6 are, for example, $SiO_2$ films. The embedded insulating films 6 are formed in the insulating layers 13 and the electrode layers 14 in the lower stacked film 2 and the electrode layers 16 and the insulating layers 17 in the upper stacked film 3. The embedded insulating films 6 penetrate the electrode layers 14 in the lower stacked film 2 and the electrode layers 16 in the upper stacked film 3 in the Z direction, extend in the Y direction, and divide the electrode layers 14 in the lower stacked film 2 and the electrode layers 16 in the upper stacked film 3 in the X direction.

The embedded insulating films 7 are formed in the upper stacked film 3 near the upper surface of the upper stacked film 3, and extend in the Z and Y directions. FIG. 1 illustrates four embedded insulating films 7 that are arranged between the embedded insulating films 6 and adjacent to each other in the X direction. The embedded insulating films 7 are, for example, $SiO_2$ films. The embedded insulating films 7 are formed in the electrode layers 16 and the insulating layers 17 in the upper stacked film 3. Specifically, as illustrated in FIG. 1, the embedded insulating films 7 are formed in the electrode layers 16 corresponding to the drain-side selection lines SGD. The embedded insulating films 7 penetrate the inside of the electrode layers 16 corresponding to the drain-side selection lines SGD in the Z direction, extend in the Y direction, and divide the electrode layers 16 corresponding to the drain-side selection lines SGD in the X direction.

The region R1 corresponds to the finger of the three-dimensional semiconductor memory. FIG. 1 illustrates one region R1 corresponding to one finger. The region R1 includes the lower stacked film 2 and the upper stacked film 3 provided between the embedded insulating films 6 adjacent to each other in the X direction. In this manner, the embedded insulating films 6 according to at least one embodiment regulate boundaries of the finger in the ±X directions.

The regions R2 correspond to pages of the three-dimensional semiconductor memory. FIG. 1 illustrates five regions R2 corresponding to five pages. The regions R2 include the plurality of source-side selection lines SGS provided between the portions P2 adjacent to each other in the X direction, the plurality of drain-side selection lines SGD provided between the embedded insulating films 7 adjacent to each other in the X direction, and the plurality of word lines WL interposed between the source-side selection lines SGS and the drain-side selection lines SGD. In this manner, the portions P2 and the embedded insulating films 7 according to at least one embodiment regulate boundaries of the pages in the ±X directions. The portions P2 and the embedded insulating films 7 separate one finger into a plurality of pages.

Figure 2:
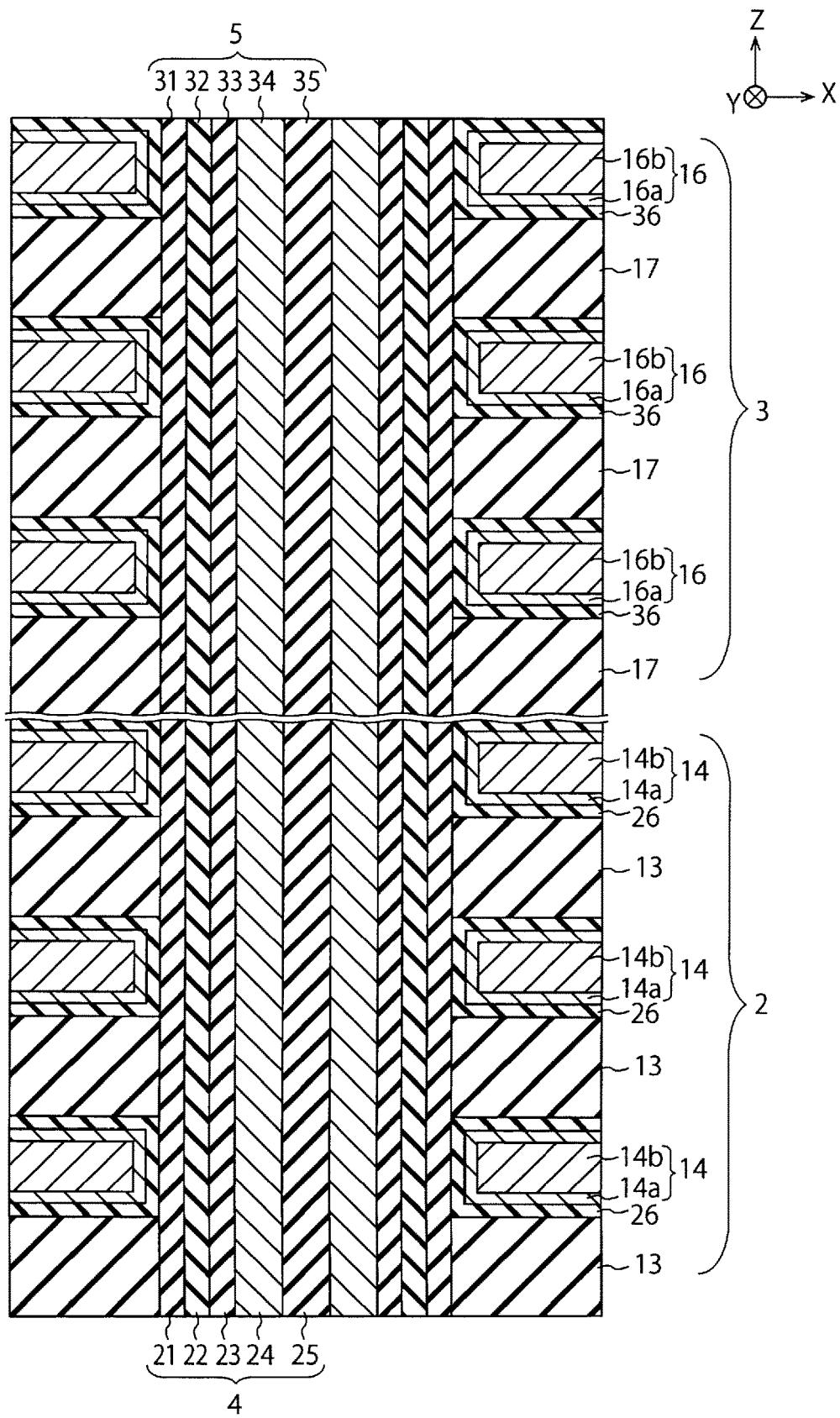
FIG. 2 is an enlarged cross-sectional view illustrating a structure of the semiconductor device according to the first embodiment.

FIG. 2 is an enlarged cross-sectional view illustrating the structure of the semiconductor device according to the first embodiment.

FIG. 2 illustrates a pair of the lower columnar portion 4 and the upper columnar portion 5 that penetrate the insides of the lower stacked film 2 and the upper stacked film 3. As illustrated in FIG. 2, the lower columnar portion 4 includes a block insulating film 21, a charge storage layer 22, a tunnel insulating film 23, a channel semiconductor layer 24, and a core insulating film 25 sequentially formed on the side surface of the lower stacked film 2. In this manner, the upper columnar portion 5 includes a block insulating film 31, a charge storage layer 32, a tunnel insulating film 33, a channel semiconductor layer 34, and a core insulating film 35 sequentially formed on the side surface of the upper stacked film 3. The block insulating films 21 and 31 are, for example, $SiO_2$ films. The charge storage layers 22 and 32 are, for example, SiN films (silicon nitride films). The charge storage layers 22 and 32 may be polysilicon layers. The tunnel insulating films 23 and 33 are, for example, $SiO_2$ films or SiON films (silicon oxynitride film). The channel semiconductor layers 24 and 34 are, for example, polysilicon layers. The channel semiconductor layers 24 and 34 are electrically connected to each other. The core insulating films 25 and 35 are, for example, $SiO_2$ films.

Each of the electrode layers 14 includes a barrier metal layer 14a and an electrode material layer 14b. The barrier metal layer 14a is, for example, a TiN film. The electrode material layer 14b is, for example, a W layer. Each of the electrode layers 14 is formed on the upper surface of the insulating layer 13, the lower surface of the insulating layer 13 (or the interlayer insulating film 15), and the side surface of the block insulating film 21 via a block insulating film 26. The block insulating films 26 may be, for example, aluminum oxide films.

Each of the electrode layers 16 includes a barrier metal layer 16a and an electrode material layer 16b. The barrier metal layer 16a is, for example, a TiN film. The electrode material layer 16b is, for example, a W layer. Each of the electrode layers 16 is formed on the lower surface of the insulating layer 17, the upper surface of the insulating layer 17 (or the interlayer insulating film 15), and the side surface of the block insulating film 31 via a block insulating film 36. The block insulating films 36 are, for example, aluminum oxide films.

Figure 3A:
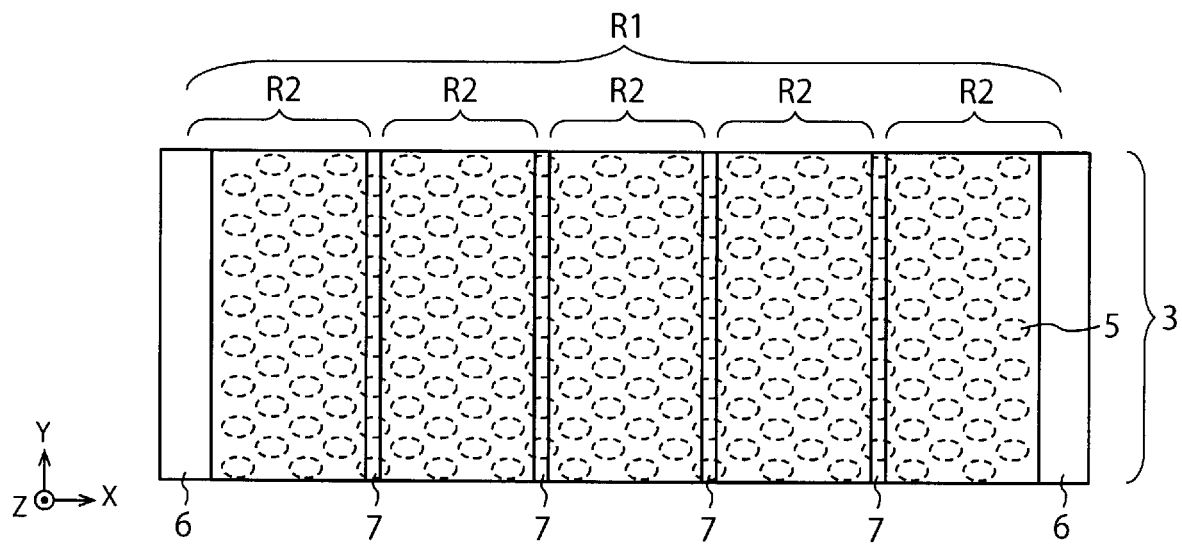
FIGS. 3A and 3B are plan views illustrating the structure of the semiconductor device according to the first embodiment.
Figure 3B:
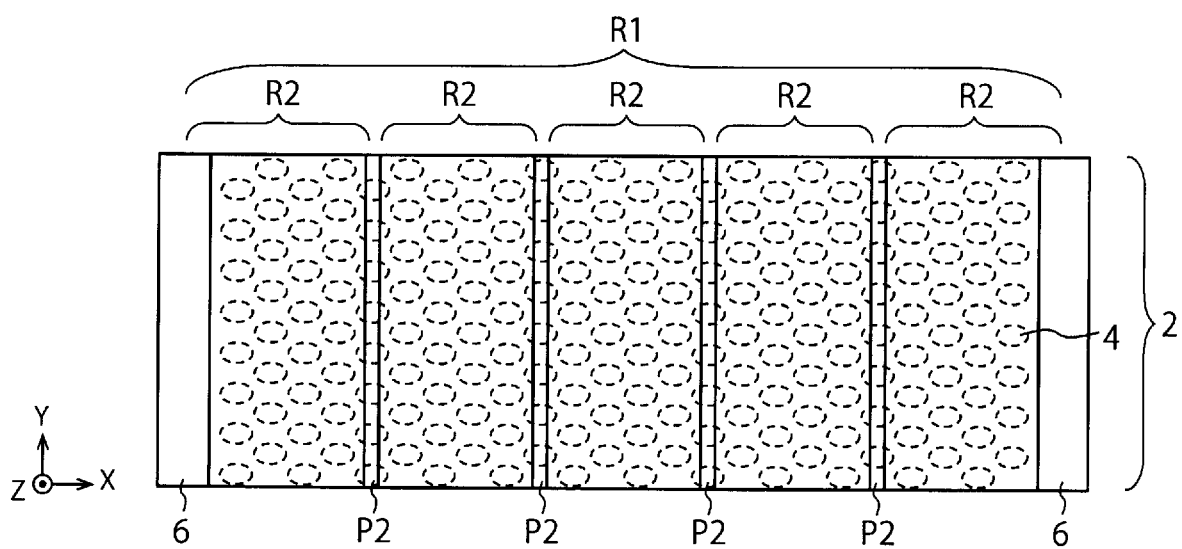

FIGS. 3A and 3B are plan views illustrating the structure of the semiconductor device according to the first embodiment.

FIG. 3A illustrates the upper stacked film 3, the upper columnar portions 5, the embedded insulating films 6, and the embedded insulating films 7. FIG. 3B illustrates the lower stacked film 2, the lower columnar portions 4, the embedded insulating films 6, and the portions P2. FIGS. 3A and 3B further illustrate the region R1 and the regions R2.

The semiconductor device according to at least one embodiment includes the plurality of embedded insulating films and the plurality of portions P2 between the embedded insulating films 6 adjacent to each other in the X direction. Therefore, the semiconductor device according to at least one embodiment includes three or more regions R2 (pages) in one region R1 (finger). In FIGS. 3A and 3B, four embedded insulating films 7 and four portions P2 are provided, and thus one region R1 includes five regions R2. As a result, these regions R2 include two regions R2 that are in contact with the embedded insulating film 6 and one or more regions R2 (here, three regions R2) that are not in contact with the embedded insulating films 6. In this case, there is a concern in that a step of substituting a sacrifice layer into the electrode layer 14 or a step of separating the electrode layers 14 becomes difficult, but this problem can be solved by at least one embodiment. Further details of this problem are described below.

As illustrated in FIGS. 3A and 3B, the semiconductor device of at least one embodiment includes the upper columnar portions 5 and the lower columnar portions 4 of a 24-unit structure in the region R1. The planar shapes of the upper columnar portions 5 and the lower columnar portions 4 are oval shapes in FIGS. 3A and 3B, but may be circular shapes instead. Examples of the upper columnar portions 5 and the lower columnar portions 4 with circular planar shapes are described below.

Figure 4A:
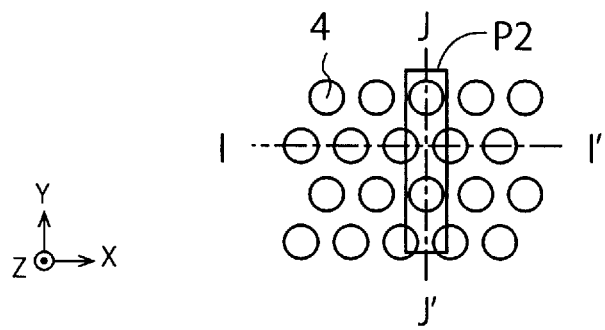
FIGS. 4A to 4C are a plan view and cross-sectional views of the structure of the semiconductor device according to the first embodiment.
Figure 4B:
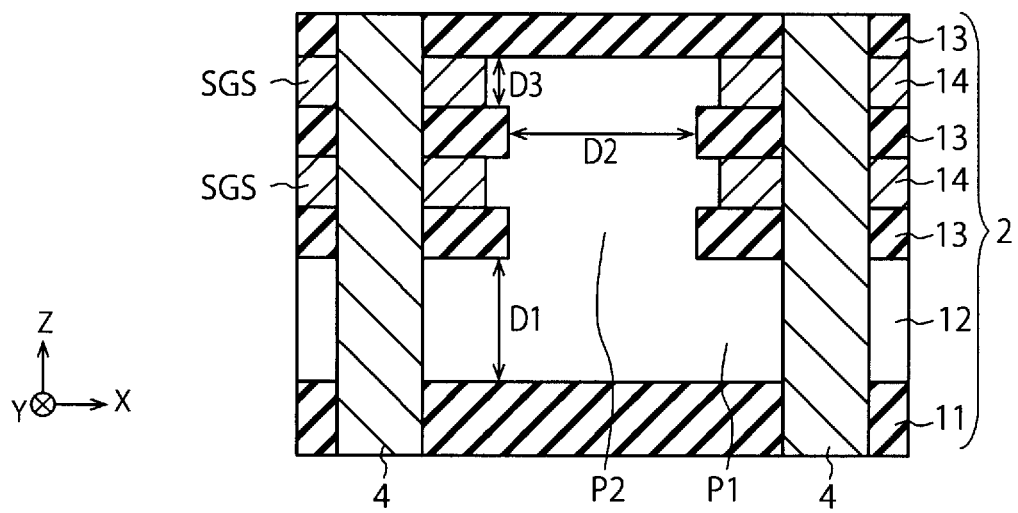
Figure 4C:
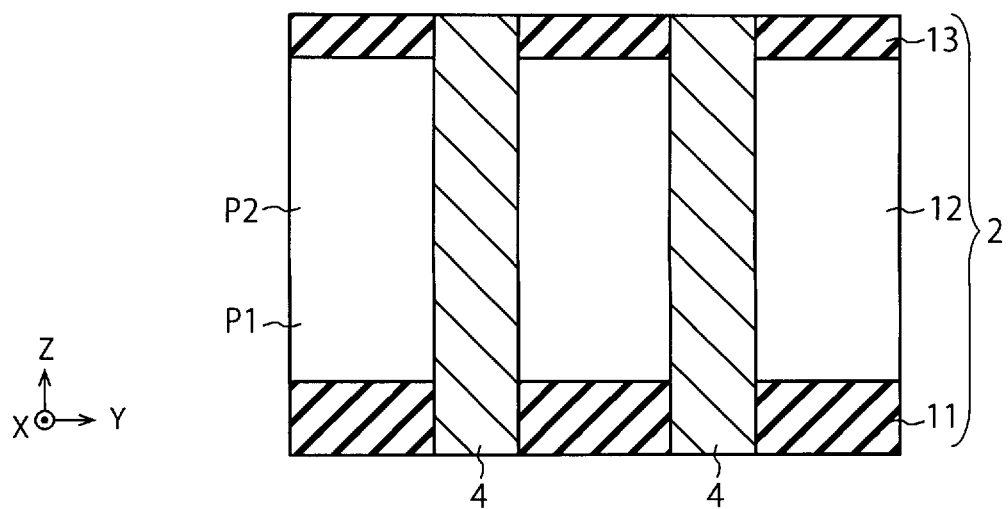

FIGS. 4A to 4C are a plan view and cross-sectional views of the structure of the semiconductor device according to the first embodiment.

FIG. 4A is a plan view illustrating a layout of the lower columnar portions 4 and the portions P2. FIG. 4B is an XZ cross-sectional view taken along the line I-I' of FIG. 4A. FIG. 4C is a YZ cross-sectional view taken along the line J-J' of FIG. 4A. FIGS. 4B and 4C are cross sections of the lower stacked film 2 near the air gap 12.

FIG. 4B illustrates a width D1 of the portion P1 in the Z direction, a width D2 of each of the portions P2 in the X direction, and a distance D3 between the insulating layers 13 adjacent to each other in the Z direction. Since the electrode layers 14 and the block insulating films 26 are formed between the insulating layers 13 (FIG. 2), the distance D3 is larger than the width of each of the electrode layers 14 in the Z direction (the thickness of each of the electrode layers 14). According to at least one embodiment, the width D1 is set to be larger than the distance D3 (D1>D3), and more specifically, is set to be two or more times of the distance D3 (D1≥2×D3). According to at least one embodiment, further, the width D2 is set to be larger than the distance D3 (D2>D3), and more specifically is set to be two or more times of the distance D3 (D2≥2×D3).

As described below, the electrode layer 14 and the air gap 12 according to at least one embodiment are formed by using sacrifice layers. Specifically, sacrifice layers are formed in a region where the electrode layer 14 is formed (electrode layer region) and in a region where the air gap 12 is formed (air gap region) and the sacrifice layers are removed thereafter. Further, the material of the electrode layer 14 is embedded in the electrode layer region and the air gap region, and the corresponding material is removed from the air gap region thereafter. In this manner, the electrode layer 14 is formed in the electrode layer region, and the air gap 12 is formed in the air gap region.

At this point, if the widths D1 and D2 are small, there is a concern in that the air gap region is closed by the material before the electrode layer region is filled with the material, and thus the electrode layer 14 cannot be appropriately formed in the electrode layer region. The reason is that there is a concern that the closed portion of the air gap region may hinder the embedding of the material in the electrode layer region. Therefore, the widths D1 and D2 according to at least one embodiment are set to be large. Specifically, the widths D1 and D2 of at least one embodiment are set to be larger than the distance D3, and for example, to be two or more times of the distance D3. Therefore, the air gap region can be prevented from being closed by the material, and the electrode layer 14 can be appropriately formed in the electrode layer region.

According to at least one embodiment, the width D2 of the portion P2 varies depending on the location (height). Specifically, the width between the side surfaces of the electrode layers 14 is larger than the width between the side surfaces of the insulating layers 13. The reason is that the side surface of the electrode layer 14 is recessed when the material is removed from the air gap region. The width D2 illustrated in FIG. 4B becomes the width between the side surfaces of the insulating layers 13. According to at least one embodiment, both of the width between the side surfaces of the electrode layers 14 and the width between the side surfaces of the insulating layers 13 are two or more times of the distance D3.

FIGS. 5 to 12 are cross-sectional views illustrating a method of manufacturing the semiconductor device according to the first embodiment.

Figure 5:
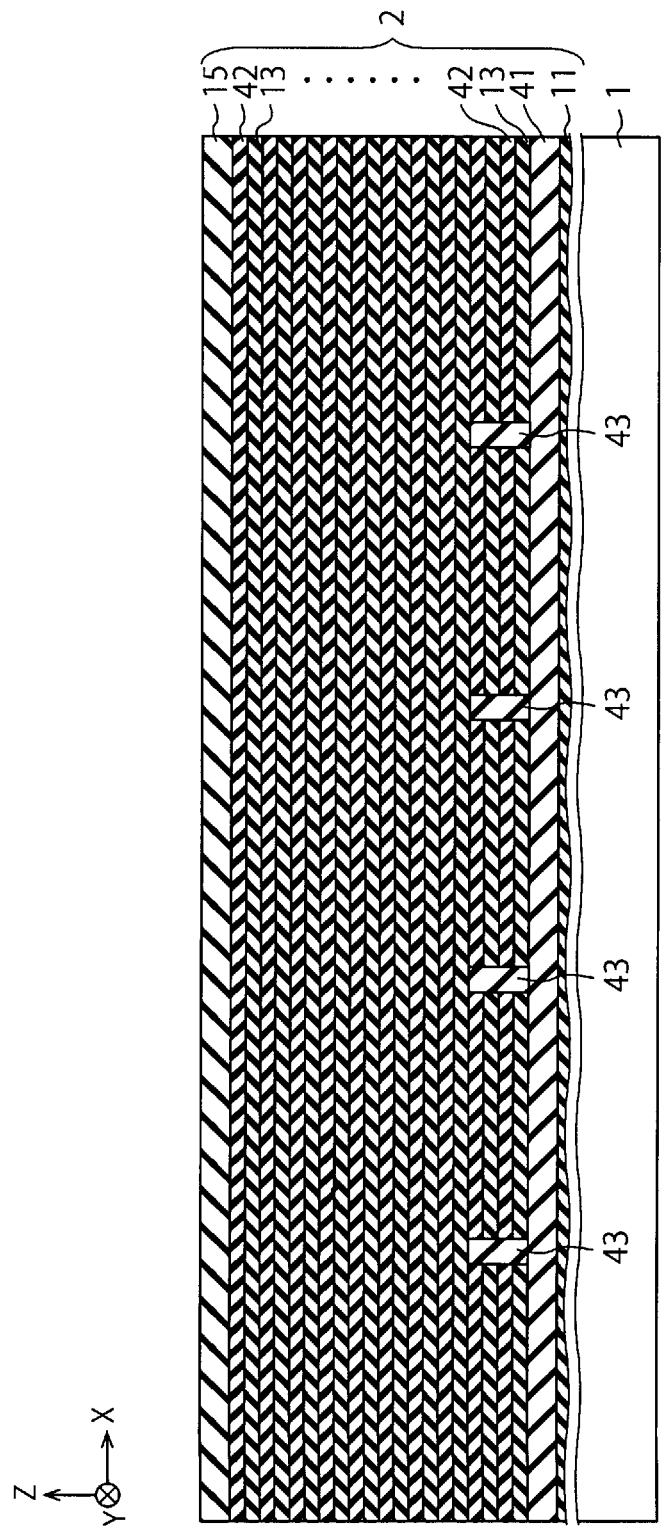
FIG. 5 is a cross-sectional view of a method of manufacturing the semiconductor device according to the first embodiment (1/8).

First, the substrate 1 is prepared, the interlayer insulating film 11 is formed on the substrate 1, and a sacrifice layer 41 is formed on the interlayer insulating film 11 (FIG. 5). The sacrifice layer 41 is used in order to form the portion P1 of the air gap 12. The sacrifice layer 41 is, for example, an SiN film. The sacrifice layer 41 is an example of a first film.

Next, the plurality of insulating layers 13 and a plurality of sacrifice layers 42 are alternately formed on the sacrifice layer 41, and a plurality of sacrifice layers 43 are formed in the insulating layers 13 and the sacrifice layers 42 (FIG. 5). The sacrifice layers 42 formed herein are used in order to form the electrode layers 14 corresponding to the source-side selection lines SGS. The sacrifice layers 42 are, for example, SiN films. The sacrifice layers 42 are an example of the first layer. However, the sacrifice layers 43 are used in order to form the portions P2 of the air gap 12. The sacrifice layers 43 are formed to be connected to the sacrifice layer 41, that is, to be in contact with the upper surface of the sacrifice layer 41. The sacrifice layers 43 are, for example, SiN films. The sacrifice layers 43 are an example of second films.

Next, the plurality of insulating layers 13 and the plurality of sacrifice layers 42 are alternately formed on the insulating layers 13, the sacrifice layers 42, and the sacrifice layers 43, and the interlayer insulating film 15 is formed on the insulating layers 13 and the sacrifice layers 42 (FIG. 5). The sacrifice layers 42 formed herein are used in order to form the electrode layers 14 corresponding to the word lines WL. The sacrifice layers 42 are, for example, SiN films. The sacrifice layers 42 are an example of the second layers.

In this manner, the lower stacked film 2 is formed on the substrate 1. However, the lower stacked film 2 illustrated in FIG. 5 includes the sacrifice layers 41, 42, and 43 instead of the portion P1, the electrode layers 14, and the portions P2.

Figure 6:
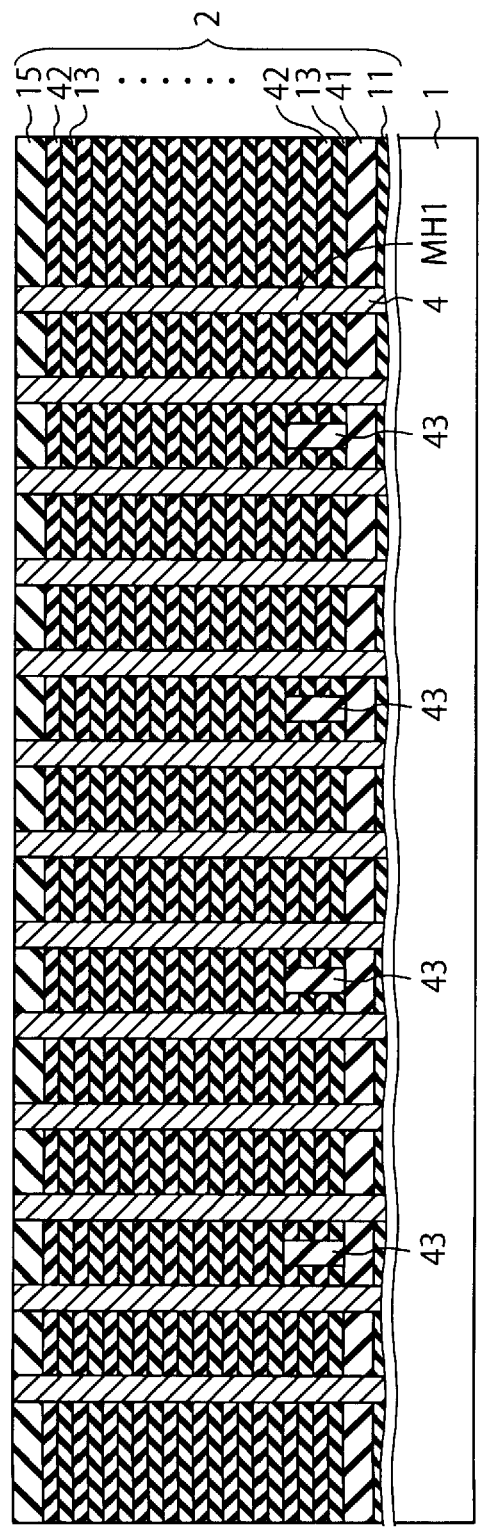
FIG. 6 is a cross-sectional view of the method of manufacturing the semiconductor device according to the first embodiment (2/8).

Next, by lithography and Reactive Ion Etching (RIE), for example, the plurality of lower memory holes MH1 are formed in the lower stacked film 2, and the plurality of lower columnar portions 4 are formed in the lower memory holes MH1 (FIG. 6). The lower memory holes MH1 have columnar shapes extending in the Z direction. In addition, each of the lower columnar portions 4 is formed by sequentially forming the block insulating film 21, the charge storage layer 22, the tunnel insulating film 23, the channel semiconductor layer 24, and the core insulating film 25 in the corresponding lower memory hole MH1 (see FIG. 2).

Figure 7:
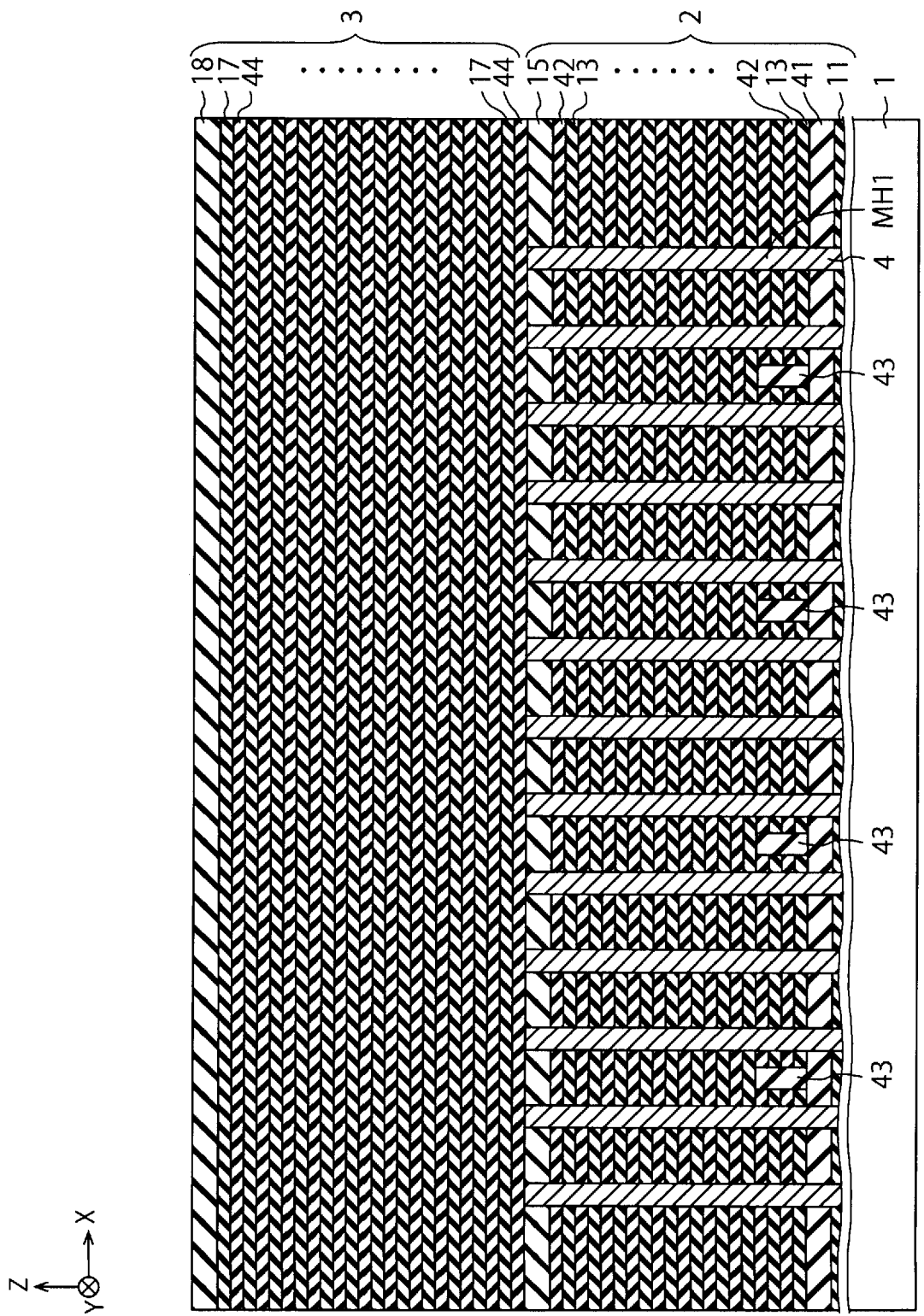
FIG. 7 is a cross-sectional view of the method of manufacturing the semiconductor device according to the first embodiment (3/8).

Next, a plurality of sacrifice layers 44 and the plurality of insulating layers 17 are alternately formed on the interlayer insulating film 15 and the lower columnar portions 4, and the interlayer insulating film 18 is formed on the sacrifice layers 44 and the insulating layers 17 (FIG. 7). The sacrifice layers 44 are used to form the electrode layers 14 corresponding to the word lines WL or the drain-side selection lines SGD. The sacrifice layers 44 are, for example, SiN films. The sacrifice layers 44 are examples of the second layers or the third layers.

In this manner, the upper stacked film 3 is formed on the lower stacked film 2. However, the upper stacked film 3 illustrated in FIG. 7 includes the sacrifice layers 44 instead of the electrode layers 16.

Figure 8:
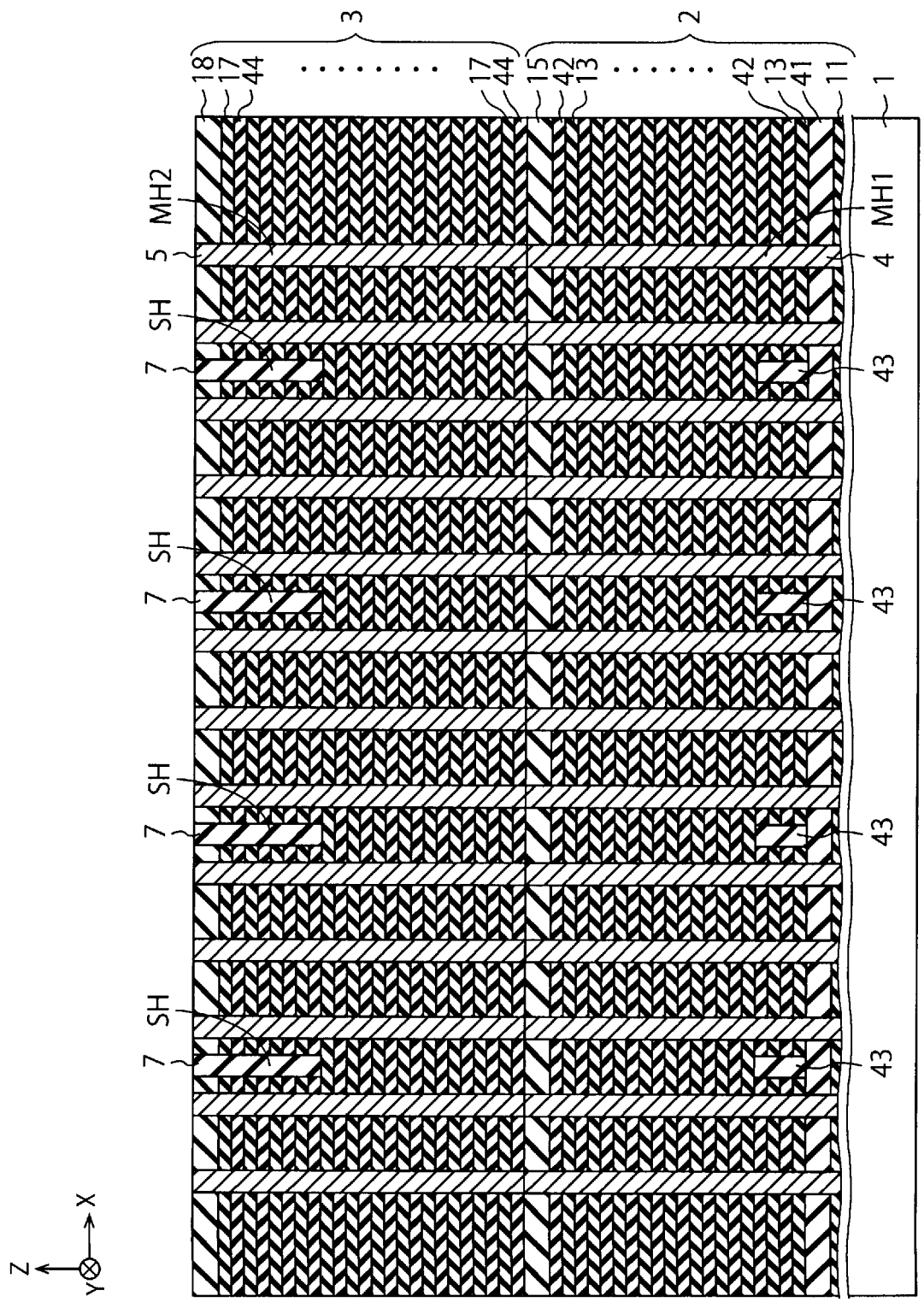
FIG. 8 is a cross-sectional view of the method of manufacturing the semiconductor device according to the first embodiment (4/8).

Next, by lithography and RIE, for example a plurality of upper memory holes MH2 are formed in the upper stacked film 3, and the plurality of upper columnar portions 5 are formed in the upper memory holes MH2 (FIG. 8). The upper memory holes MH2 have columnar shapes extending in the Z direction and are formed on the corresponding lower memory holes MH1. In addition, each of the upper columnar portions 5 is formed by sequentially forming the block insulating film 31, the charge storage layer 32, the tunnel insulating film 33, the channel semiconductor layer 34, and the core insulating film 35 in the corresponding upper memory holes MH2 (see FIG. 2). As a result, the channel semiconductor layer 34 is electrically connected to the corresponding channel semiconductor layer 24.

In addition, in the step illustrated in FIG. 6, the lower memory holes MH1 are formed in the lower stacked film 2, and resist films may be formed in the lower memory holes MH1. In addition, in the step illustrated in FIG. 8, the upper memory holes MH2 are formed on the lower memory holes MH1 in the upper stacked film 3, the resist films are removed from the lower memory holes MH1, and the lower columnar portions 4 and the upper columnar portions 5 may be simultaneously formed in the lower memory holes MH1 and the upper memory holes MH2. In this case, the common material for the block insulating films 21 and 31, the common material for the charge storage layers 22 and 32, the common material for the tunnel insulating films 23 and 33, the common material for the channel semiconductor layers 24 and 34, and the common material for the core insulating films 25 and 35 are sequentially formed in the lower memory holes MH1 and the upper memory holes MH2.

Next, by lithography and RIE, a plurality of holes SH are formed in the upper stacked film 3, and the plurality of embedded insulating films 7 are formed in the holes SH (FIG. 8). The holes SH extend in the Z and Y directions and are formed to be adjacent to each other in the X direction. The holes SH are formed in the sacrifice layers 44 in order to form the electrode layers 16 corresponding to the drain-side selection lines SGD. The sacrifice layers 44 are an example of the third layers, and the other sacrifice layers 44 are an example of the second layers.

Figure 9:
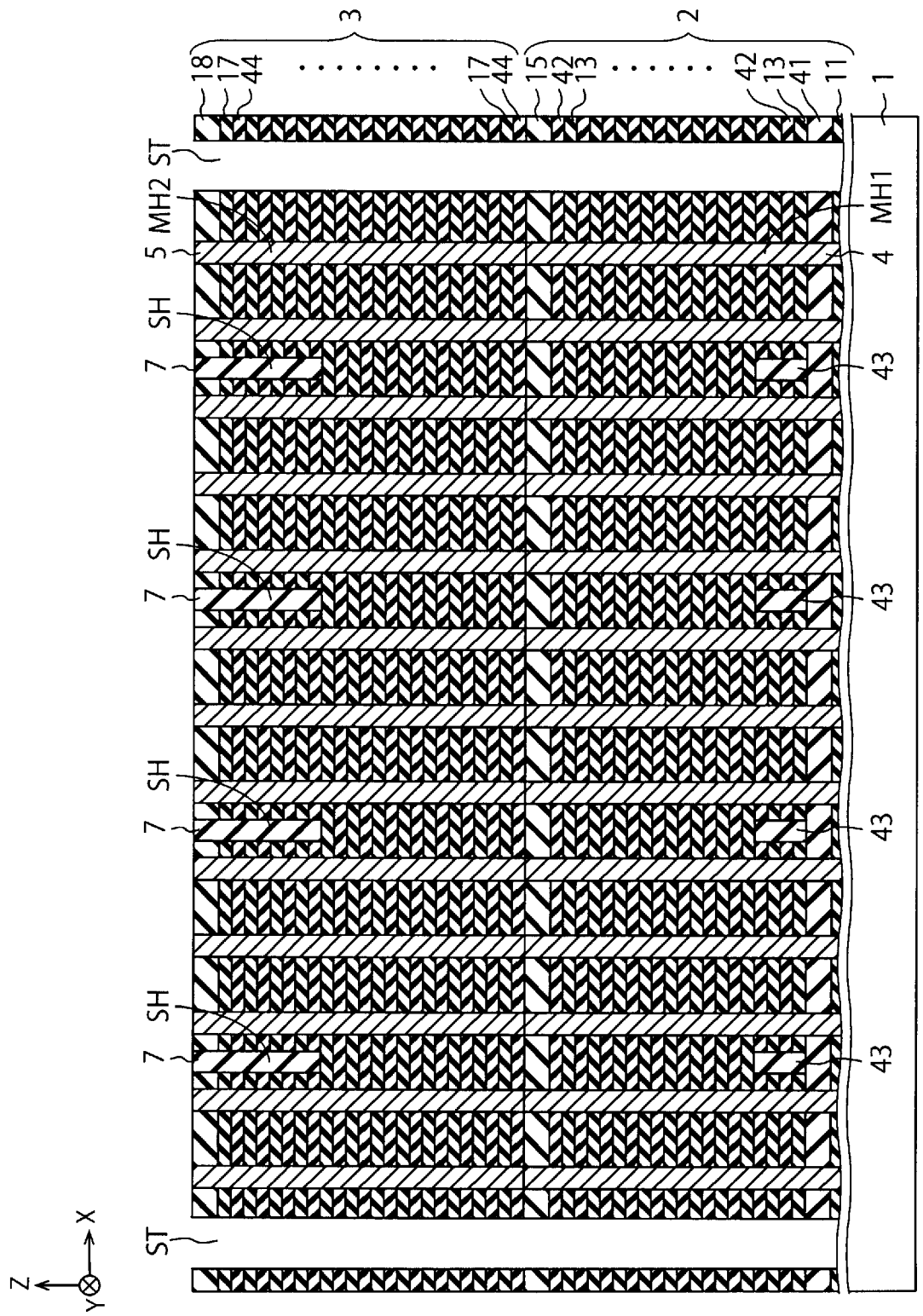
FIG. 9 is a cross-sectional view of the method of manufacturing the semiconductor device according to the first embodiment (5/8).

Next, by lithography and RIE, a plurality of slits ST are formed in the upper stacked film 3 and the lower stacked film 2 (FIG. 9). The slits ST are formed to extend in the Z and Y directions and to be adjacent to each other in the X direction. The embedded insulating films 6 are embedded in the slits ST in the step described below. In FIG. 9, the plurality of embedded insulating films 7, the plurality of sacrifice layers 43, and the sacrifice layer 41 under the sacrifice layers 43 are provided between the slits ST. The two slits ST illustrated in FIG. 9 are an example of first and second openings.

Figure 10:
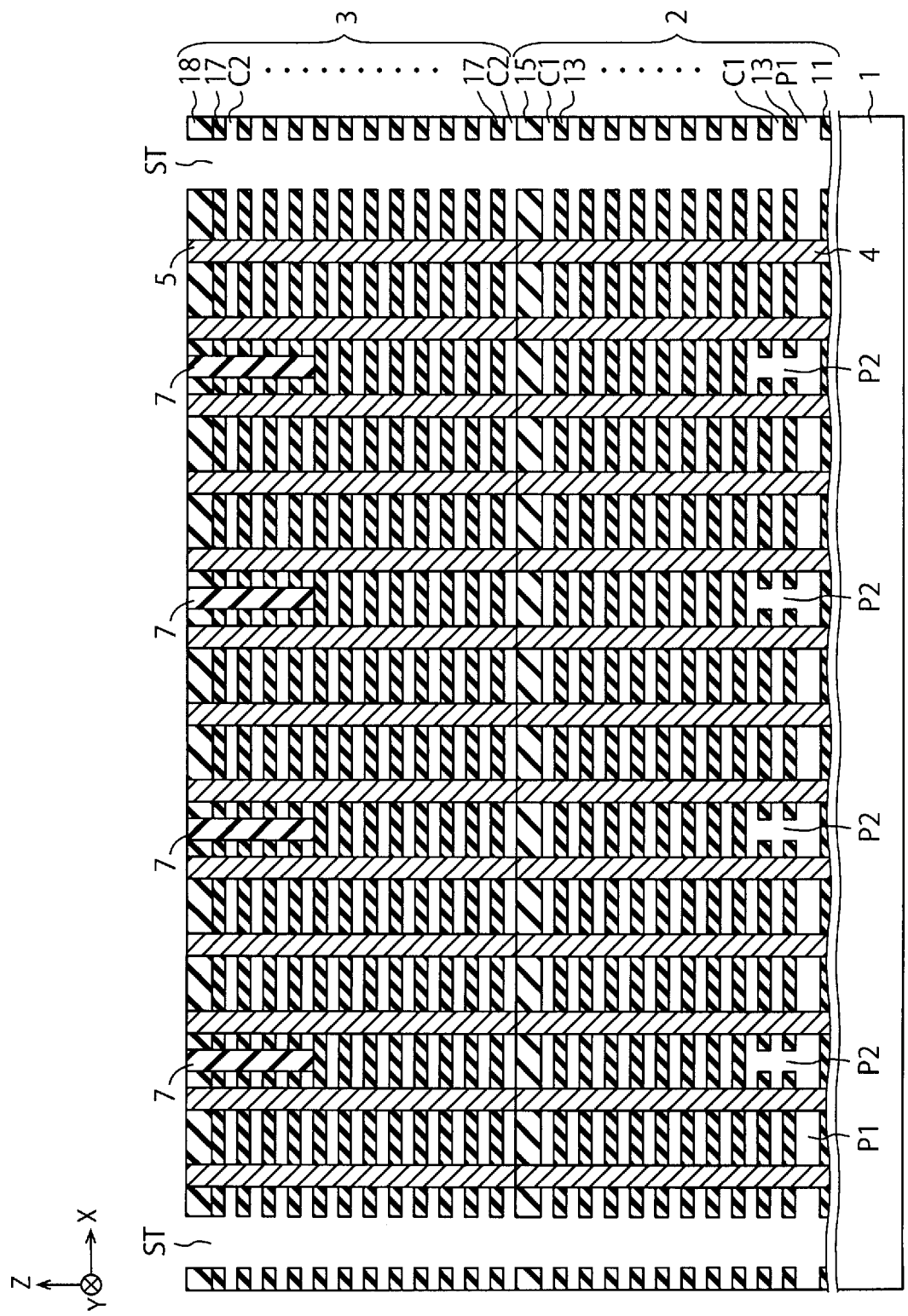
FIG. 10 is a cross-sectional view of the method of manufacturing the semiconductor device according to the first embodiment (6/8).

Next, the sacrifice layers 41, 42, 43, and 44 are removed from the slits ST by wet etching (FIG. 10). As a result, a plurality of cavities C1 are formed in the regions from which the sacrifice layers 42 are removed, and a plurality of cavities C2 are formed in the regions from which the sacrifice layers 44 are removed. Further, the portion P1 of the air gap 12 is formed in the region from which the sacrifice layer 41 is removed, and the plurality of portions P2 of the air gap 12 are formed in the regions from which the sacrifice layers 43 are removed.

Figure 11:
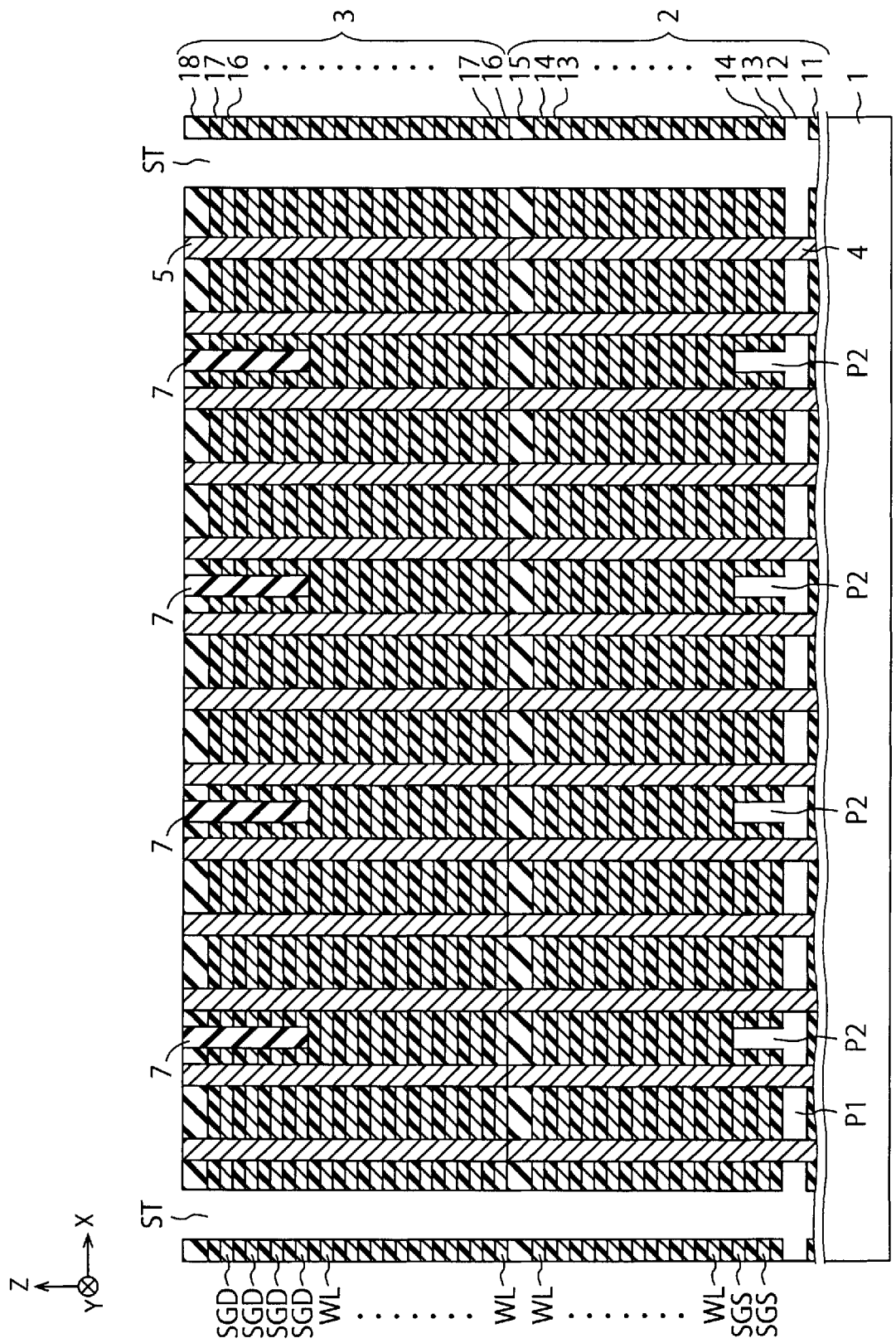
FIG. 11 is a cross-sectional view of the method of manufacturing the semiconductor device according to the first embodiment (7/8).

Next, the materials of the electrode layers 14 and 16 are embedded from the slits ST into the cavities C1 and C2 (FIG. 11). As a result, the plurality of electrode layers 14 are formed in the cavities C1, and the plurality of electrode layers 16 are formed in the cavities C2. The electrode layers 14 and 16 are formed in the cavities C1 and C2 by sequentially forming the common materials for the barrier metal layers 14a and 16a and the common materials for the electrode material layer 14b and 16b (see FIG. 2). Before the electrode layers 14 and 16 are formed, the common materials for the block insulating films 26 and 36 are formed in the cavities C1 and C2 (see FIG. 2). These materials are formed in the cavities C1 and C2 and the portions P1 and P2 and are removed from the portions P1 and P2, thereafter. In this manner, the sacrifice layers 42 and 44 are substituted with the electrode layers 14 and 16.

Figure 12:
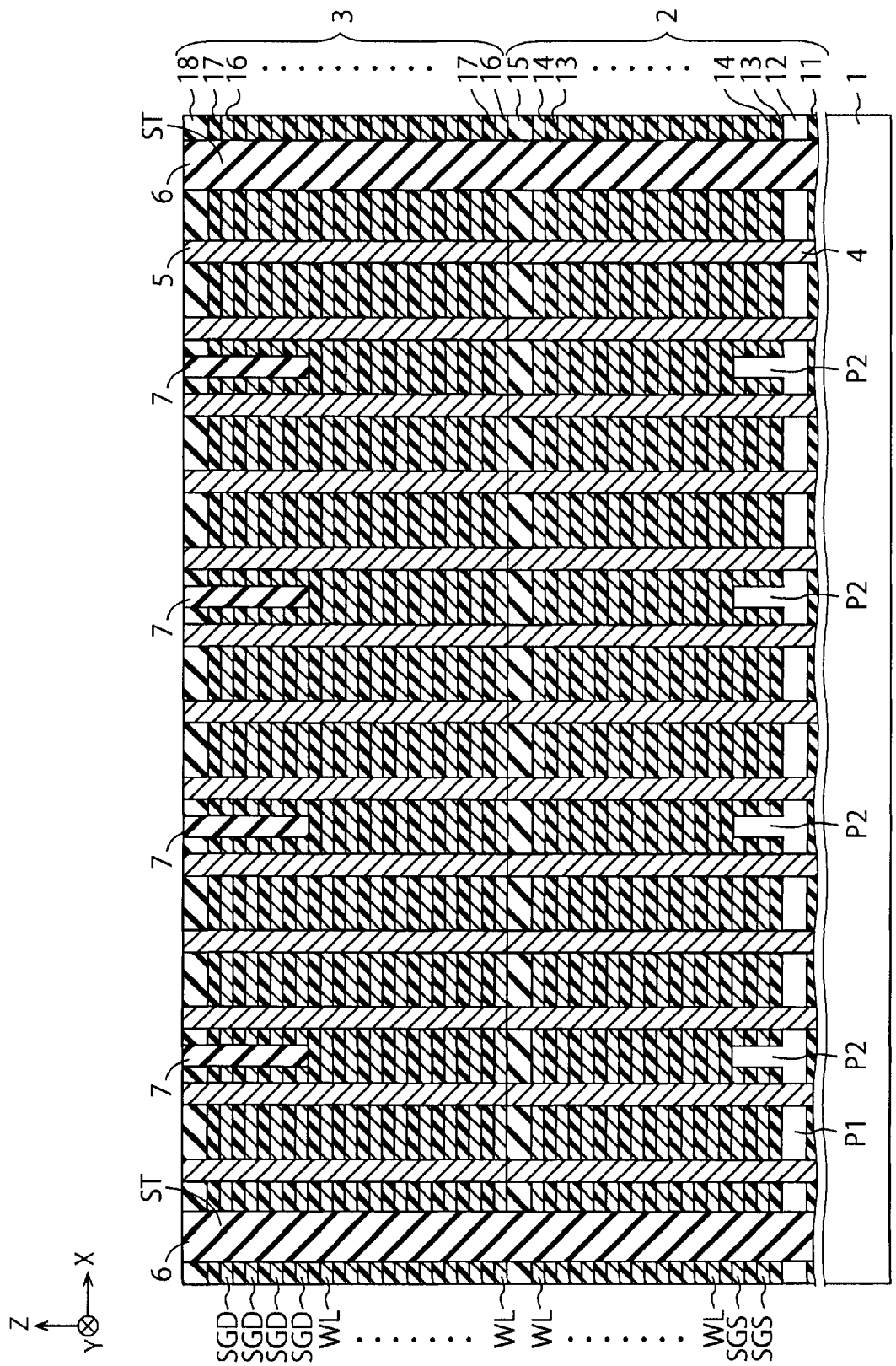
FIG. 12 is a cross-sectional view of the method of manufacturing the semiconductor device according to the first embodiment (8/8).

Next, the embedded insulating films 6 are formed in the slits ST (FIG. 12). Thereafter, various insulating films, interconnection layers, plug layers, and the like are formed on the substrate 1. In this manner, the semiconductor device according to at least one embodiment is manufactured.

In addition, the holes SH and the embedded insulating films 7 may be formed after the step of FIG. 11 instead of being formed in the step of FIG. 8. In this case, the holes SH are formed in the electrode layers 16, the insulating layers 17, and the interlayer insulating film 18.

FIGS. 13A to 14C are enlarged cross-sectional views illustrating the method of manufacturing the semiconductor device according to the first embodiment. FIGS. 13A to 14B illustrate details of the step illustrated in FIG. 5.

Figure 13A:
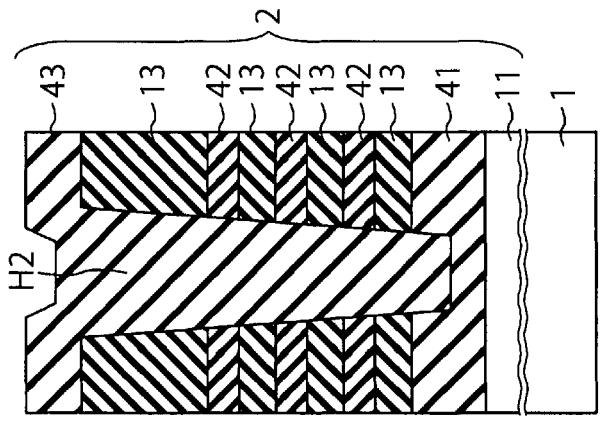
FIGS. 13A to 13C are enlarged cross-sectional views illustrating the method of manufacturing the semiconductor device according to the first embodiment (1/2).

First, the substrate 1 is prepared, the interlayer insulating film 11 is formed on the substrate 1, and the sacrifice layer 41 is formed on the interlayer insulating film 11 (FIG. 13A). Next, the plurality of insulating layers 13 and the plurality of sacrifice layers 42 are alternately formed on the sacrifice layer 41, and a resist film 51 is formed on the insulating layers 13 and the sacrifice layers 42 (FIG. 13A). At this point, the thickness of the uppermost insulating layer 13 is set to be thicker than the thickness of the other insulating layers 13. Next, a hole H1 is formed in the resist film 51 (FIG. 13A). The hole H1 is formed to extend in the Y direction.

Figure 13B:
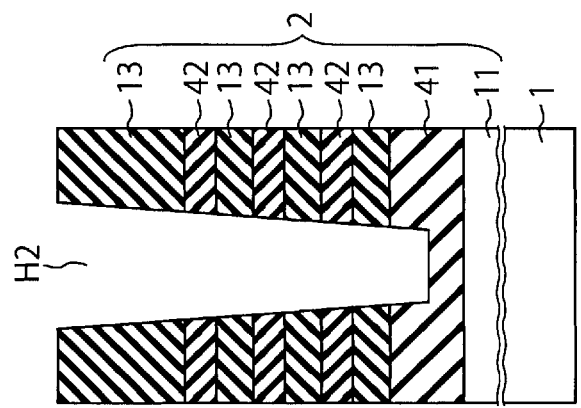

Next, by RIE, for example, in which the resist film 51 is used as a mask, a hole H2 is formed in the insulating layers 13 and the sacrifice layers 42, and the resist film 51 is removed thereafter (FIG. 13B). The hole H2 is formed to extend in the Y and Z directions. The hole H2 is an example of a third opening.

Figure 13C:
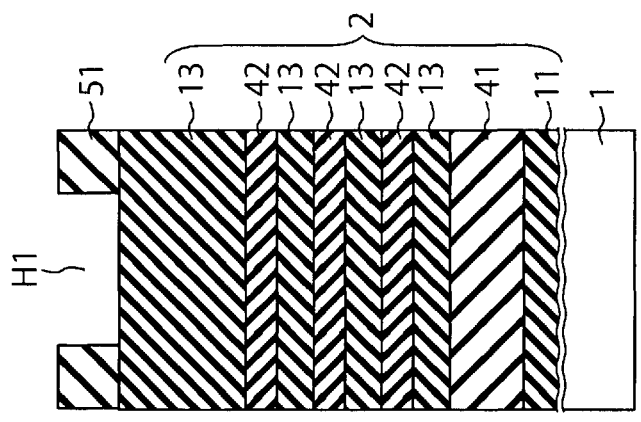

Next, the sacrifice layers 43 are formed on the entire surface of the substrate 1 (FIG. 13C). As a result, the sacrifice layer 43 is formed inside the hole H2 or outside the hole H2.

Next, the sacrifice layer 43 is processed by etch back (FIG. 14A). As a result, the sacrifice layer 43 formed outside the hole H2 is removed.

Next, the sacrifice layer 43 and the front surface of the uppermost insulating layer 13 are polished by Chemical Mechanical Polishing (CMP) (FIG. 14B). As a result, the sacrifice layer 43 and the front surface of the uppermost insulating layer 13 are flattened. Further, the uppermost insulating layer 13 is thinned.

Next, the plurality of insulating layers 13 and the plurality of sacrifice layers 42 are alternately formed on the corresponding sacrifice layers 43 and the corresponding uppermost insulating layer 13, the interlayer insulating film 15 (not illustrated) is formed on the insulating layers 13 and the sacrifice layers 42 (FIG. 14C). In this manner, the lower stacked film 2 is formed on the substrate 1.

In addition, the sacrifice layers 43 illustrated in FIG. 5 are in contact with the lower surface of the insulating layer 13. However, the sacrifice layer 43 illustrated in FIG. 14C is in contact with the lower surface of the sacrifice layer 42. The sacrifice layer 43 according to at least one embodiment may have the shape illustrated in FIG. 5 or may have the shape illustrated in FIG. 14C. If the sacrifice layer 43 illustrated in FIG. 14C is formed, a portion of the space obtained by removing the sacrifice layer 42 also becomes the portion P2 of the air gap 12.

FIGS. 15A to 19C are plan views and cross-sectional views illustrating the method of manufacturing the semiconductor device according to the first embodiment.

Figure 15A:
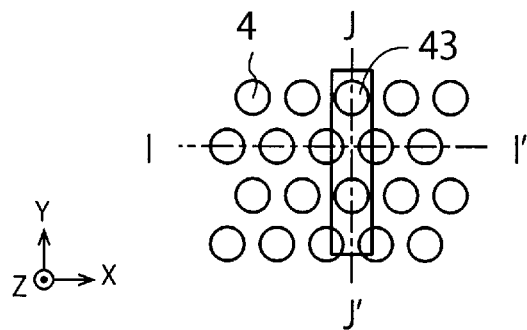
FIGS. 15A to 15C are a plan view and cross-sectional views illustrating the method of manufacturing the semiconductor device according to the first embodiment (1/5).
Figure 15B:
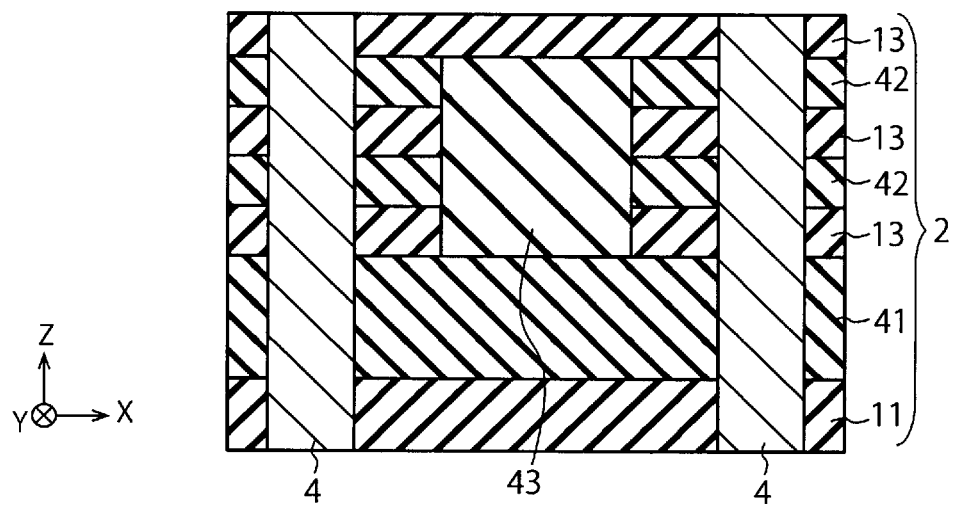
Figure 15C:
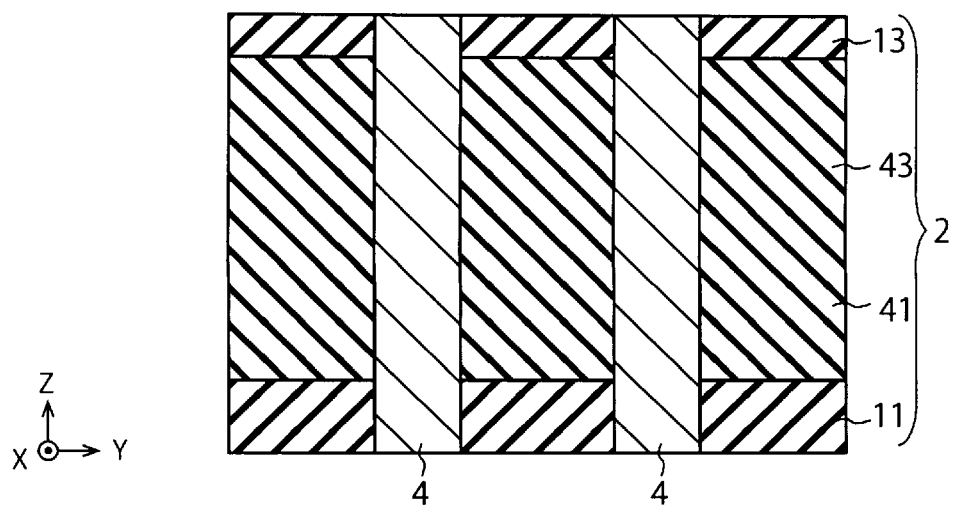

FIGS. 15A, 15B, and 15C correspond to the plan view of FIG. 4A, the XZ cross-sectional view of FIG. 4B, and the YZ cross-sectional view of FIG. 4C. These are also applied to FIGS. 16A to 19C, in the same manner. FIGS. 15A to 19C illustrate details of the steps of FIGS. 9 to 12.

FIGS. 15A to 15C illustrate the lower stacked film 2 after the step illustrated in FIG. 9. Accordingly, the slits ST (not illustrated) are provided in the lower stacked film 2.

Figure 16A:
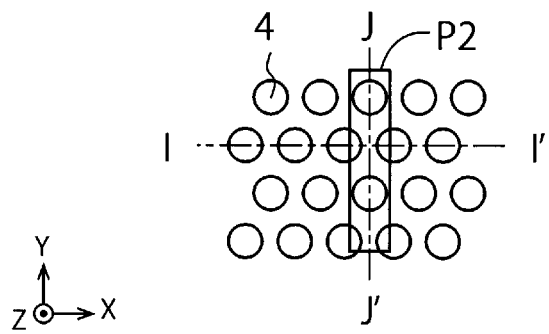
FIGS. 16A to 16C are a plan view and cross-sectional views illustrating the method of manufacturing the semiconductor device according to the first embodiment (2/5).
Figure 16B:
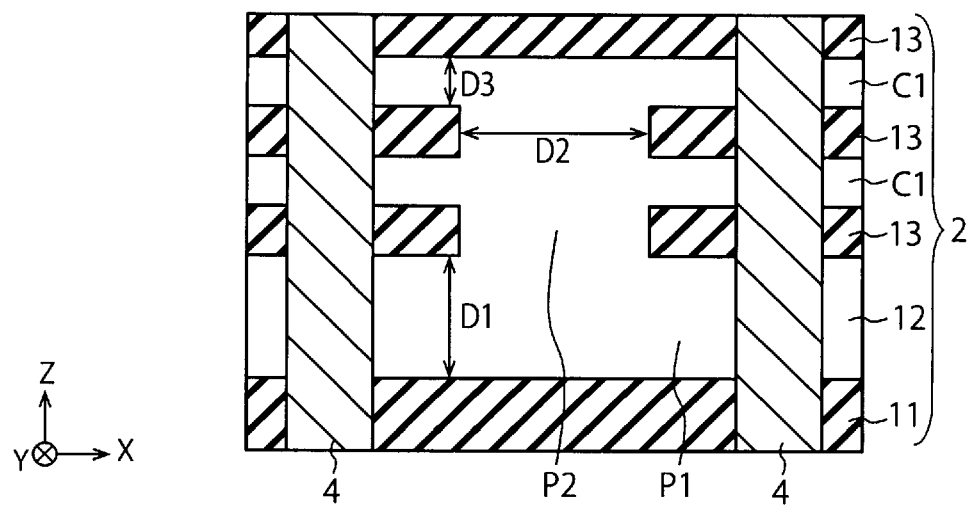
Figure 16C:
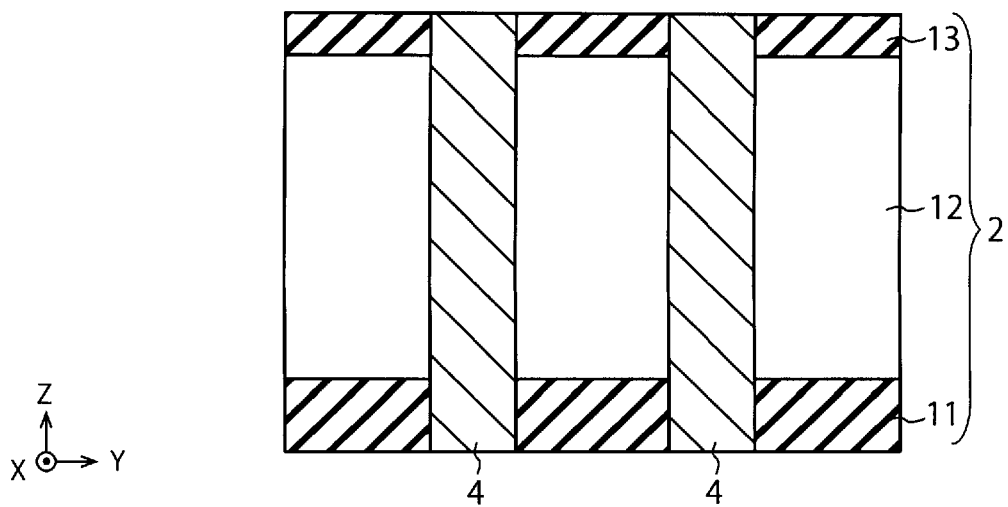

Next, the sacrifice layers 41, 42, and 43 in the lower stacked film 2 are removed from the slits ST (FIGS. 16A to 16C). As a result, the portion P1 of the air gap 12 is formed in the region from which the sacrifice layer 41 is removed, the cavities C1 are formed in the regions from which the sacrifice layers 42 are removed, and the portions P2 of the air gap 12 are formed in the regions from which the sacrifice layers 43 are removed. FIG. 16B illustrates the width D1 of the portion P1 in the Z direction, the width D2 of the portion P2 in the X direction, and the distance D3 between the insulating layers 13 adjacent to each other in the Z direction.

Figure 17A:
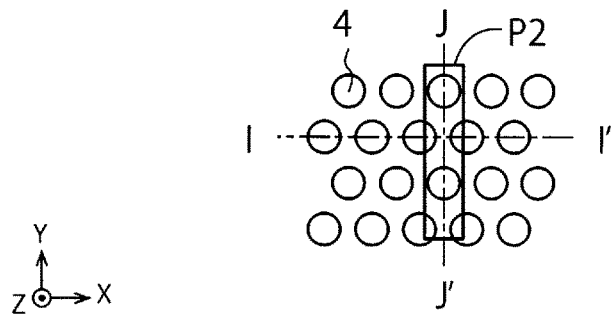
FIGS. 17A to 17C are a plan view and cross-sectional views illustrating the method of manufacturing the semiconductor device according to the first embodiment (3/5).
Figure 17B:
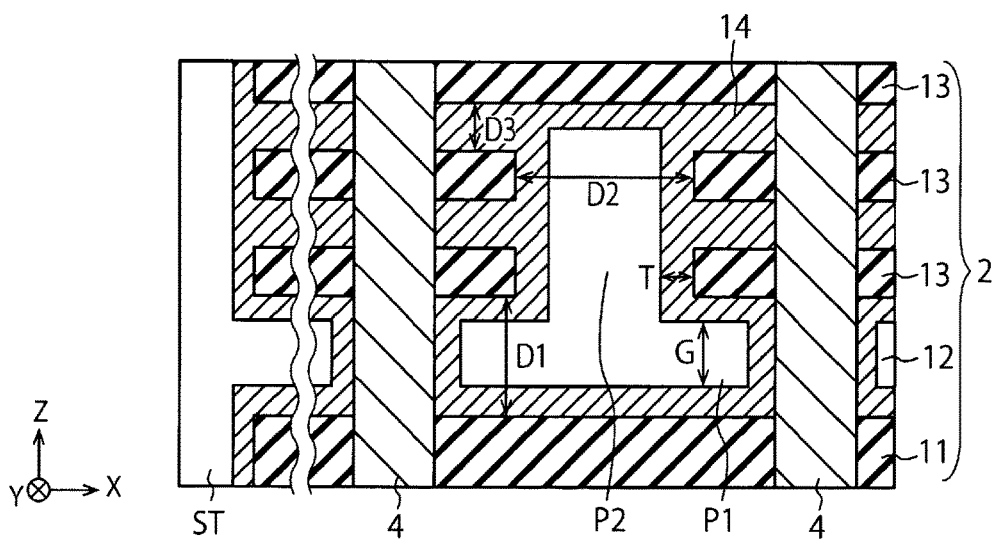
Figure 17C:
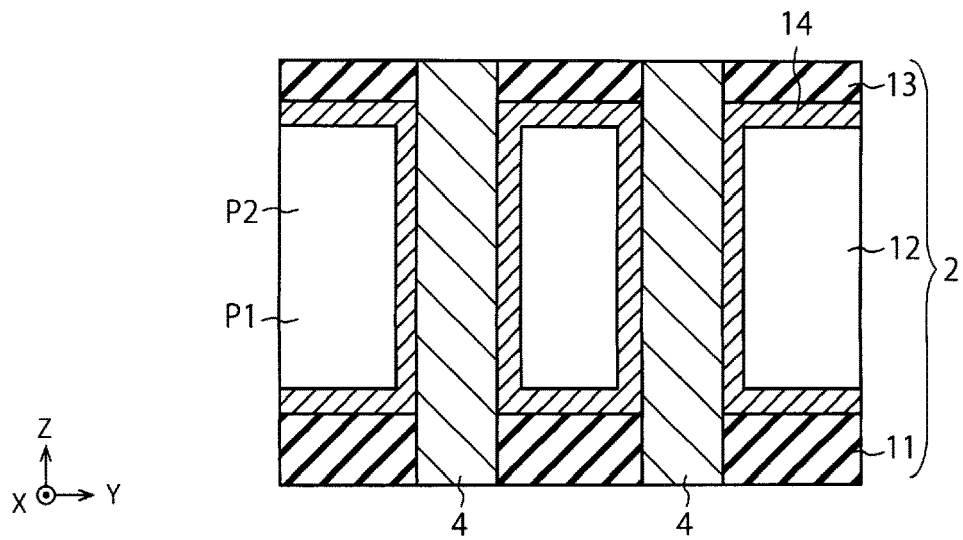

Next, the materials of the electrode layers 14 are embedded from the slits ST into the cavities C1 (FIGS. 17A to 17C). Specifically, the materials of the block insulating films 26, the material of the barrier metal layer 14a, and the material of the electrode material layer 14b are sequentially formed in the cavities C1 (see FIG. 2).

These materials are also formed in the air gap 12. However, since the widths D1 and D2 of at least one embodiment are set to be larger than the distance D3, for example, set to be two or more times of the distance D3, the closure of the air gap 12 by the materials can be prevented. Therefore, these materials can be appropriately embedded between the insulating layers 13. In FIGS. 17B and 17C, gaps between the insulating layers 13 are completely filled with these materials, but the air gap 12 is not completely filled with these materials.

FIG. 17B illustrates a total thickness T of the materials of the block insulating films 26, the barrier metal layer 14a, and the electrode material layer 14b, and a width G of a space remaining in the portion P1 of the air gap 12 in the Z direction. In FIG. 17B, the relationships of T>0, G>0, D1>2T, D2>2T, D3<2T, and G=D1−2T are satisfied.

Figure 18A:
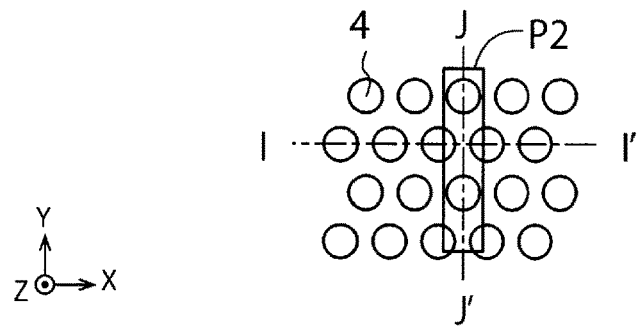
FIGS. 18A to 18C are a plan view and cross-sectional views illustrating the method of manufacturing the semiconductor device according to the first embodiment (4/5).
Figure 18B:
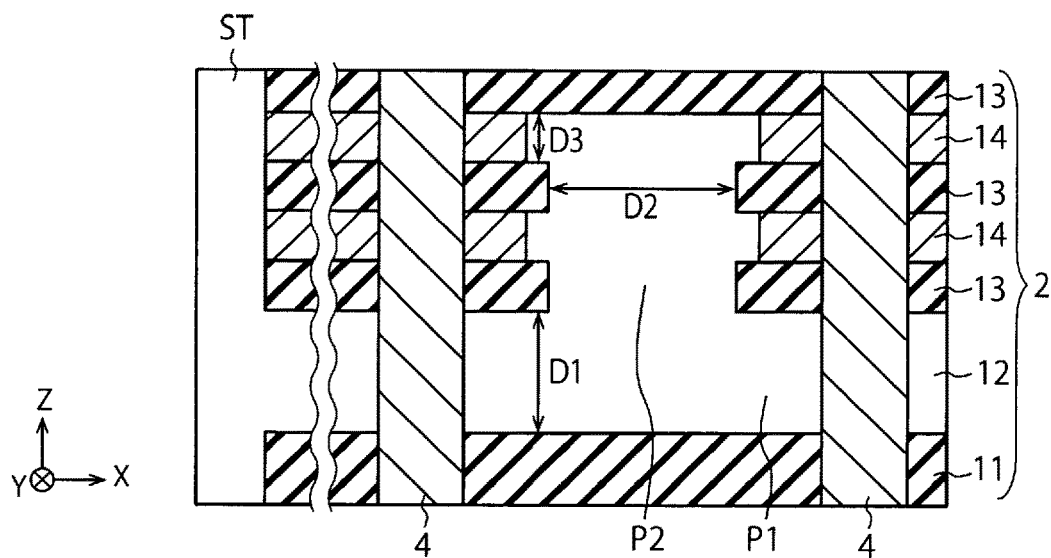
Figure 18C:
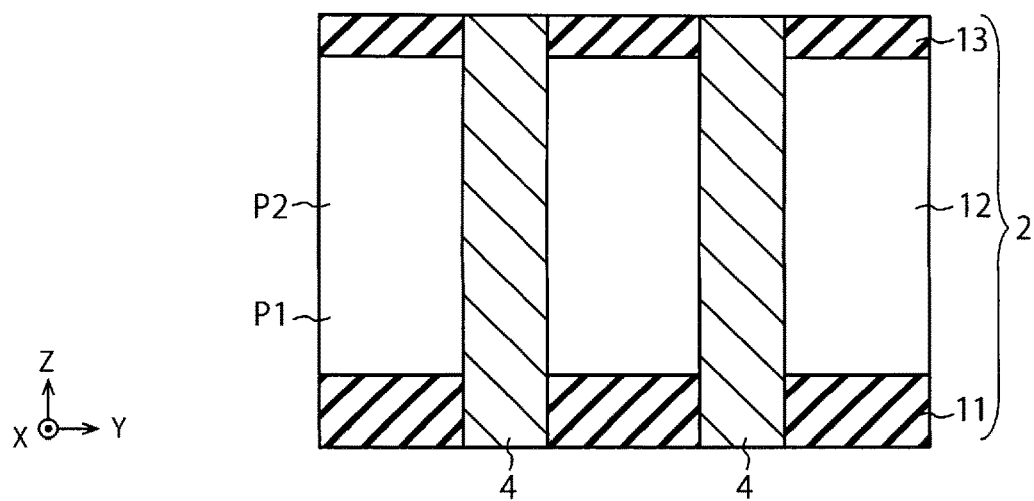

Next, by wet etching from the slits ST, excess materials of the block insulating films 26, the barrier metal layer 14a, and the electrode material layer 14b are removed from the air gap 12 (FIGS. 18A to 18C). In this manner, as illustrated in FIG. 18B, the electrode layers 14 (and the block insulating films 26) are formed between the insulating layers 13.

Figure 19A:
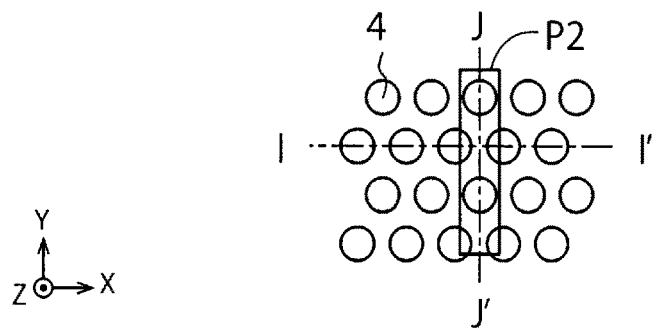
FIGS. 19A to 19C are a plan view and cross-sectional views illustrating the method of manufacturing the semiconductor device according to the first embodiment (5/5).
Figure 19B:
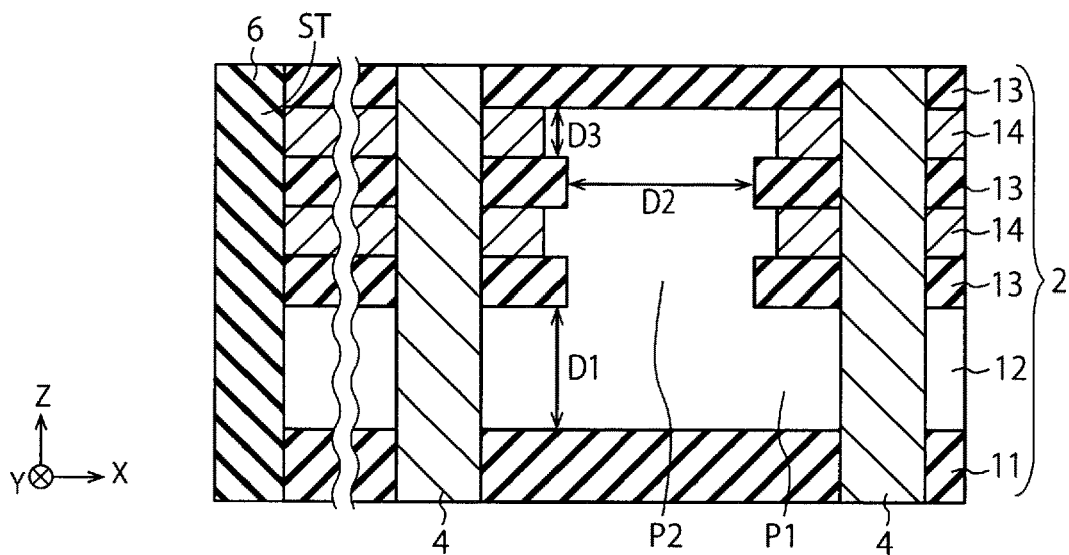
Figure 19C:
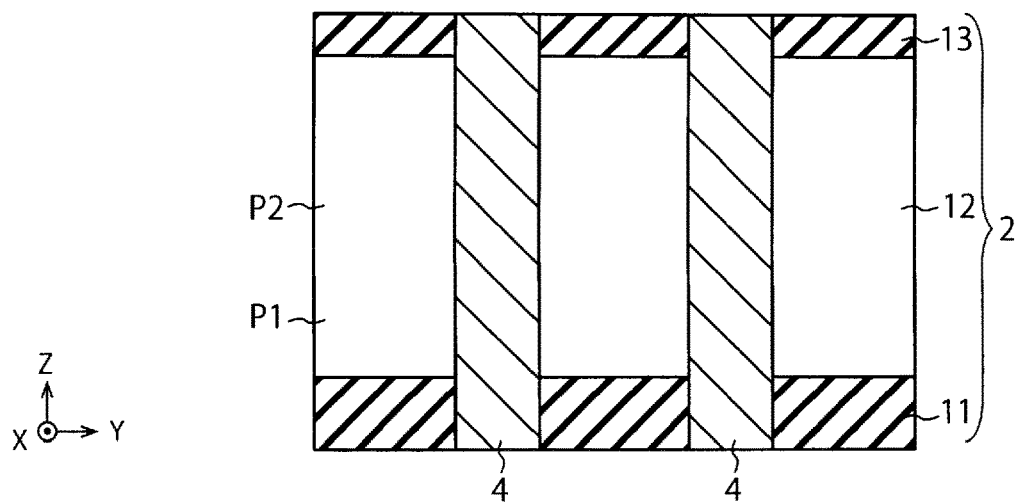

Next, the embedded insulating films 6 are formed in the slits ST (FIGS. 19A to 19C). Thereafter, various insulating films, interconnection layers, plug layers, and the like are formed on the substrate 1. In this manner, the semiconductor device according to at least one embodiment is manufactured.

Figure 20A:
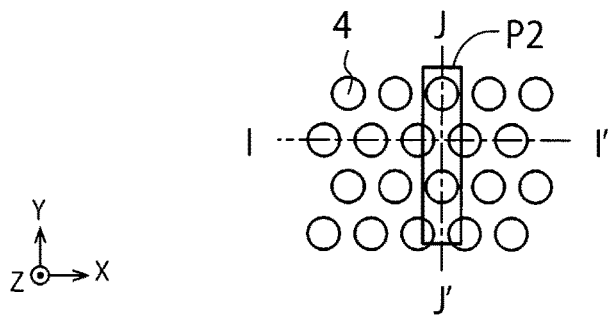
FIGS. 20A to 20C are a plan view and cross-sectional views illustrating the method of manufacturing the semiconductor device according to a first modification of the first embodiment.
Figure 20B:
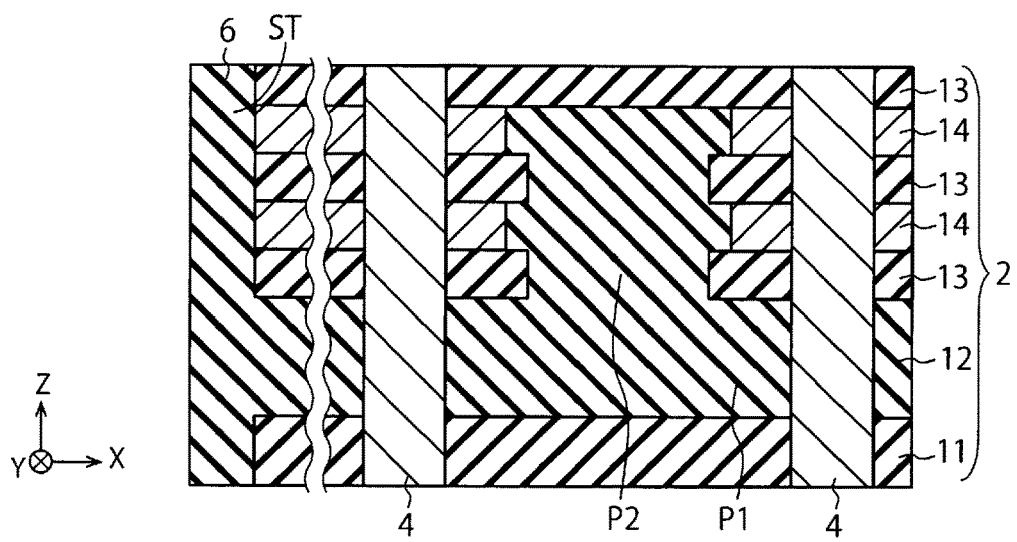
Figure 20C:
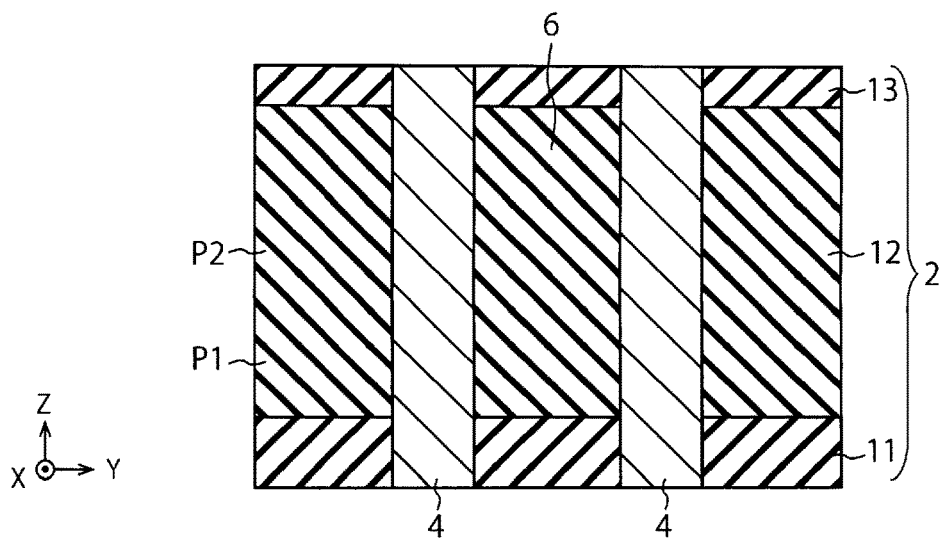

FIGS. 20A to 20C are a plan view and cross-sectional views illustrating the method of manufacturing the semiconductor device according to a first modification of the first embodiment.

The steps illustrated in FIGS. 19A to 19C may be substituted with the steps illustrated in FIGS. 20A to 20C. In FIGS. 20A to 20C, the embedded insulating films 6 are embedded in the air gap 12, and the air gap 12 disappears. The embedded insulating film 6 in the air gap 12 is an example of the third insulating film. The embedded insulating film 6 in the portion P1 is an example of the first portion. The embedded insulating film 6 in the portion P2 is an example of the second portion.

In addition, the relationships of the widths D1, D2, and D3 are satisfied with respect to the embedded insulating film 6 in the air gap 12. The width D1 indicates the width of the embedded insulating film 6 in the portion P1 in the Z direction. The width D2 indicates the width of the embedded insulating film 6 in the portion P2 in the X direction. The distance D3 indicates the distance between the insulating layers 13 adjacent to each other in the Z direction. The above relational expressions "D1>D3", "D2>D3", "D1≥2×D3", and "D2≥2×D3" are satisfied in at least one modification.

In addition, the insulating film embedded in the air gap according to at least one modification may also be an insulating film other than the embedded insulating film 6. In this case, the corresponding insulating film is embedded in the air gap 12, and then the embedded insulating film 6 is embedded in the slit ST. The corresponding insulating film in the air gap 12 is an example of the third insulating film. The corresponding insulating film in the portion P1 is an example of the first portion. The corresponding insulating film in the portion P2 is an example of the second portion.

Figure 21A:
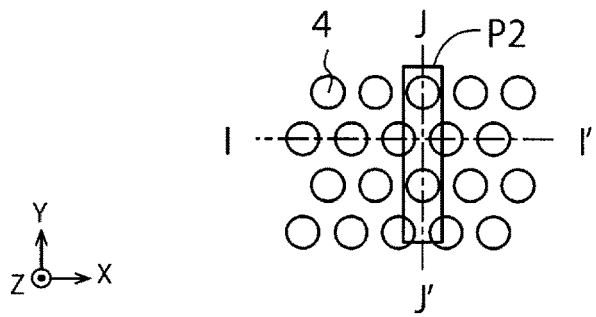
FIGS. 21A to 21C are a plan view and cross-sectional views illustrating the method of manufacturing the semiconductor device according to a second modification of the first embodiment.
Figure 21B:
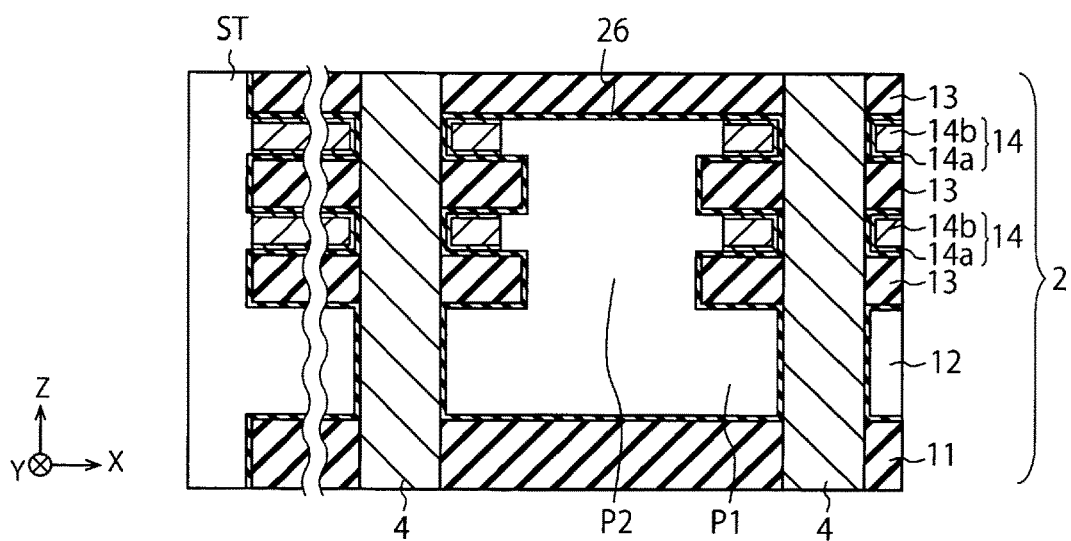
Figure 21C:
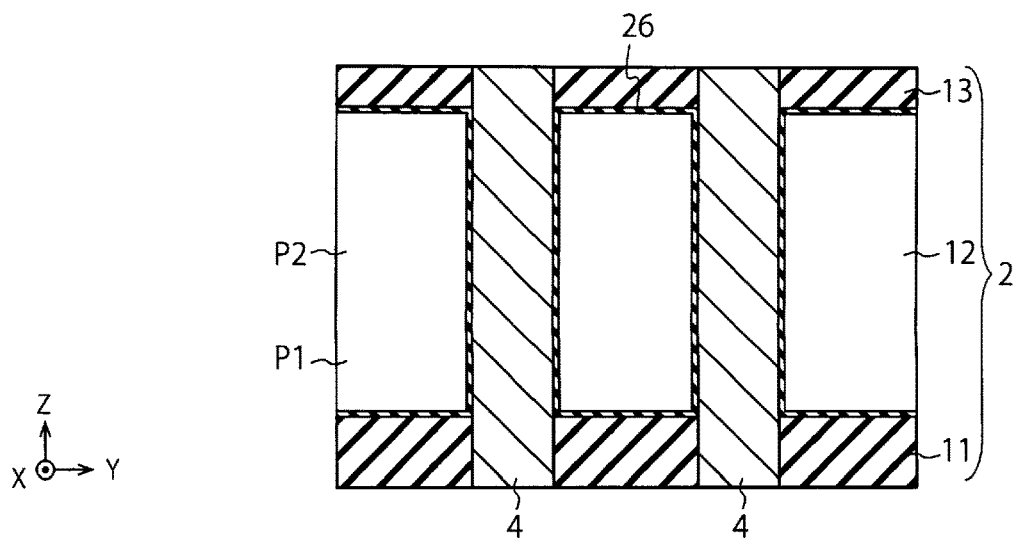

FIGS. 21A to 21C are a plan view and cross-sectional views illustrating the method of manufacturing the semiconductor device according to a second modification of the first embodiment.

The steps illustrated in FIGS. 18A to 18C may be substituted with the steps illustrated in FIGS. 21A to 21C. In FIGS. 21A to 21C, the block insulating films 26, the barrier metal layers 14a, and the electrode material layers 14b which are not illustrated in the above figures are illustrated.

According to the present modification, when the excess materials of the block insulating films 26, the barrier metal layers 14a, and the electrode material layers 14b are removed from the air gaps 12, the excess materials of the barrier metal layer 14a and the electrode material layer 14b are removed from the air gaps 12, but the excess materials of the block insulating films 26 are not removed from the air gaps 12. Therefore, the block insulating films 26 remain on the front surfaces of the insulating layers 13 or the like in the air gaps 12. The block insulating films 26 may remain also in the semiconductor device of a finished product.

Figure 22A:
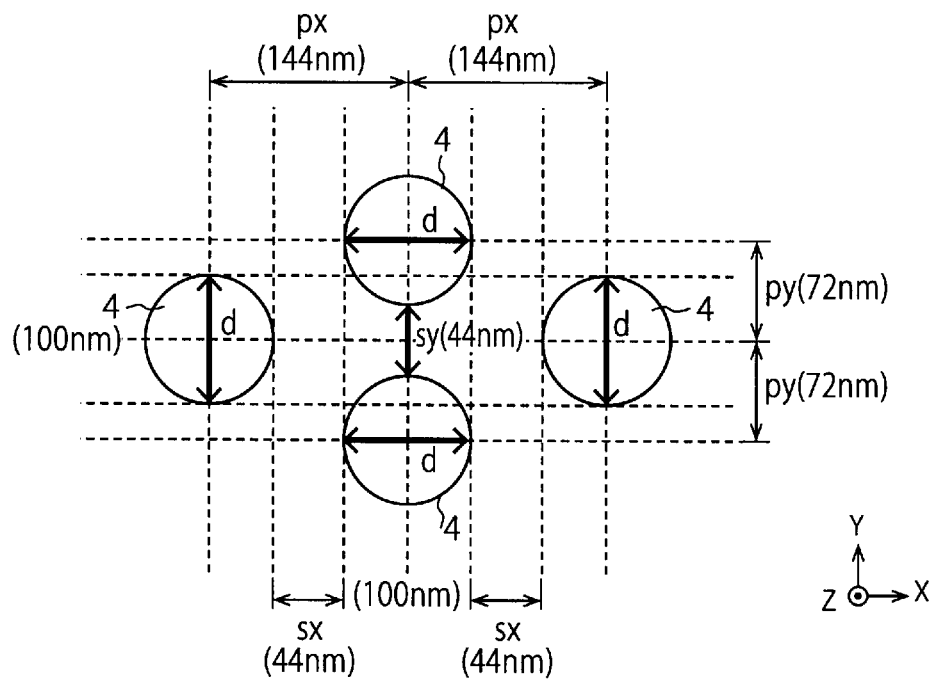
FIGS. 22A and 22B are plan views illustrating the structure of the semiconductor device according to the first embodiment.
Figure 22B:
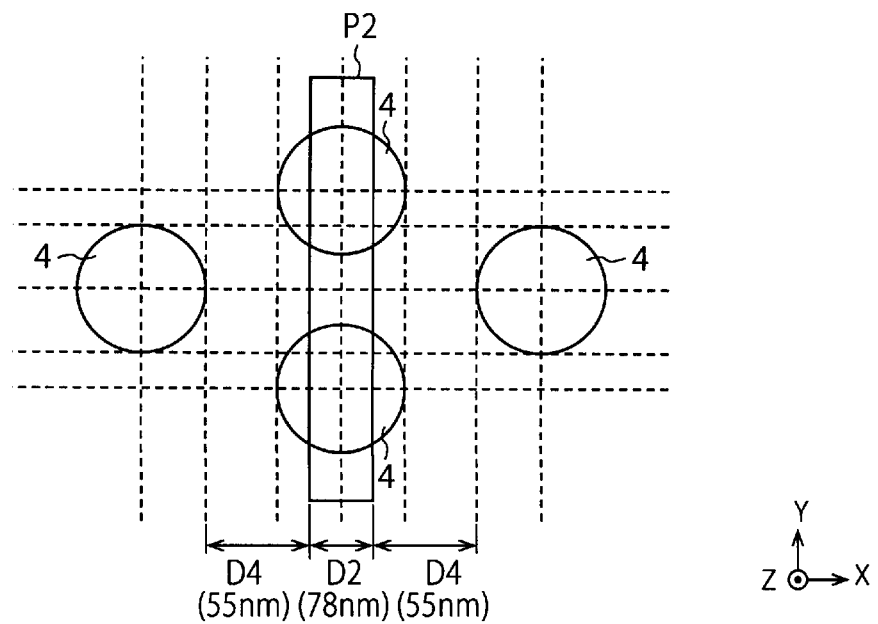

FIGS. 22A and 22B are plan views illustrating the structure of the semiconductor device according to the first embodiment.

FIG. 22A is a plan view illustrating the layout of the lower columnar portions 4. As illustrated in FIG. 3B, 4A, or the like, the lower columnar portions 4 of at least one embodiment are arranged on the substrate 1 in a two-dimensional array shape, and specifically, arranged in the triangular lattice shape. FIG. 22A illustrates the four lower columnar portions 4 adjacent to each other in the two-dimensional array.

FIG. 22A illustrates diameters d of the lower columnar portions 4 in the XY cross section, pitches px between the lower columnar portions 4 in the X direction, pitches py between the lower columnar portions 4 in the Y direction, distances sx between the lower columnar portions 4 in the X direction, and distances sy between the lower columnar portions 4 in the Y direction. Further, FIG. 22A illustrates d=100 nm, px=144 nm, py=72 nm, sx=44 nm, and sy=44 nm as examples of dimensions thereof.

FIG. 22B is a plan view illustrating the layout of the lower columnar portions 4 and the portions P2. FIG. 22B illustrates the width D2 between the portions P2 in the X direction and distances D4 between the portion P2 and the adjacent lower columnar portions 4. Further, FIG. 22B indicates D2=78 nm, and D4=55 nm as examples of dimensions thereof.

The value of the diameter d is given by, for example, 89±11 nm in consideration of the difference in the diameter d for each lower columnar portion 4, the difference in the diameter d in accordance with the height of the XY cross section of the lower columnar portion 4. In addition, the width D2 is given by D2=2px−2D4−d. In this expression, px=144 nm, D4=55 nm, and d=89±10 nm are substituted to obtain D2=89±11 nm. Therefore, the minimum value of D2 becomes 78 nm (Result 1).

However, the width D2 is preferably set to two or more times of the distance D3 as described above (D2≥2×D3). The distance D3 is given by, for example, 18±2 nm. Accordingly, if this value is substituted into the above expression, D2≥36±4 nm is obtained. Therefore, in order to prevent the closure of the air gap 12, D2 is preferably set to 40 nm or more (Result 2).

The minimum value of Result 1 satisfies the conditions of Result 2. Therefore, according to the dimension examples illustrated in FIGS. 22A and 22B, the closure of the air gap 12 can be prevented. In contrast, by giving the values of px, D4, and d so that the conditions of Result 2 are satisfied, the closure of the air gap 12 can be prevented.

Hereinafter, with reference to FIGS. 1 to 22B, further details of the semiconductor device according to at least one embodiment and the manufacturing method thereof are described.

In the semiconductor device according to at least one embodiment (FIG. 1), while the electrode layers 16 corresponding to the drain-side selection lines SGD are separated from each other by the embedded insulating films 7, the electrode layers 14 corresponding to the source-side selection lines SGS are separated by the portions P2 of the air gap 12. The drain-side selection lines SGD are formed near the upper surface of the upper stacked film 3, and thus the embedded insulating films 7 are easily formed at positions for separating the drain-side selection lines SGD. However, the source-side selection lines SGS are formed near the lower surface of the lower stacked film 2, and thus the embedded insulating films are hardly formed at positions for separating the source-side selection lines SGS. Therefore, according to at least one embodiment, the sacrifice layers 43 are formed when the lower stacked film 2 is formed (FIG. 5), and the sacrifice layers 43 are removed after the upper stacked film 3 is formed (FIG. 10). Accordingly, the electrode layers 14 corresponding to the source-side selection lines SGS can be easily separated by the portions P2 of the air gap 12.

Here, it is assumed that the embedded insulating films are formed instead of the sacrifice layers 43 when the lower stacked film 2 is formed. In this case, the sacrifice layers 41 and 42 are removed by wet etching (FIGS. 10 and 16B), the embedded insulating film interferes wet etching. Further, when the materials of the electrode layers 14 in the cavities C1 are embedded (FIGS. 11 and 17B), the embedded insulating film interferes the embedding of the materials. According to at least one embodiment, the problem can be prevented not by forming embedded insulating films but by forming the sacrifice layers 43 when the lower stacked film 2 is formed.

In addition, even if the sacrifice layers 43 are formed when the lower stacked film 2 is formed, if the widths D1 and D2 are small, there is a concern in that the air gap 12 is closed by the materials of the electrode layers 14. According to at least one embodiment, by setting the widths D1 and D2 to be large, the closure of the air gap 12 by the materials of the electrode layers 14 can be prevented. Therefore, the widths D1 and D2 according to at least one embodiment are set to be larger than the distance D3, and for example, are set to be two or more times of the distance D3.

It is likely that the embedded insulating films 7 for the drain-side selection lines SGD interfere with wet etching or embedding of the materials, in the same manner as the embedded insulating films for the source-side selection lines SGS. Therefore, the electrode layers 16 corresponding to the drain-side selection lines SGD may be also separated by air gaps. The example of the air gap is described in a second embodiment.

As described above, the semiconductor device according to at least one embodiment includes the air gap 12 including the portion P1 provided between the interlayer insulating film 11 and the insulating layers 13, and the plurality of portions P2 provided in the electrode layers 14 of the portion P1 in the +Z direction. Therefore, according to at least one embodiment, the electrode layers 14 corresponding to the source-side selection lines SGS can be easily separated from each other.

The structure of the semiconductor device according to at least one embodiment may be applied not only to a case where one region R1 (finger) includes three or more regions R2 (pages), but also to a case where one region R1 only includes two regions R2. However, if one region R1 includes three or more regions R2, the above closure occurs more easily in the region R2 that is not in contact with the embedded insulating film 6, compared with the region R2 that is in contact with the embedded insulating film 6. Therefore, if one region R1 includes three or more regions R2, there is a large advantage of employing the structure of the semiconductor device according to at least one embodiment. This is also applied in the same manner to the semiconductor device according to the second embodiment described below.

Second Embodiment

Figure 23:
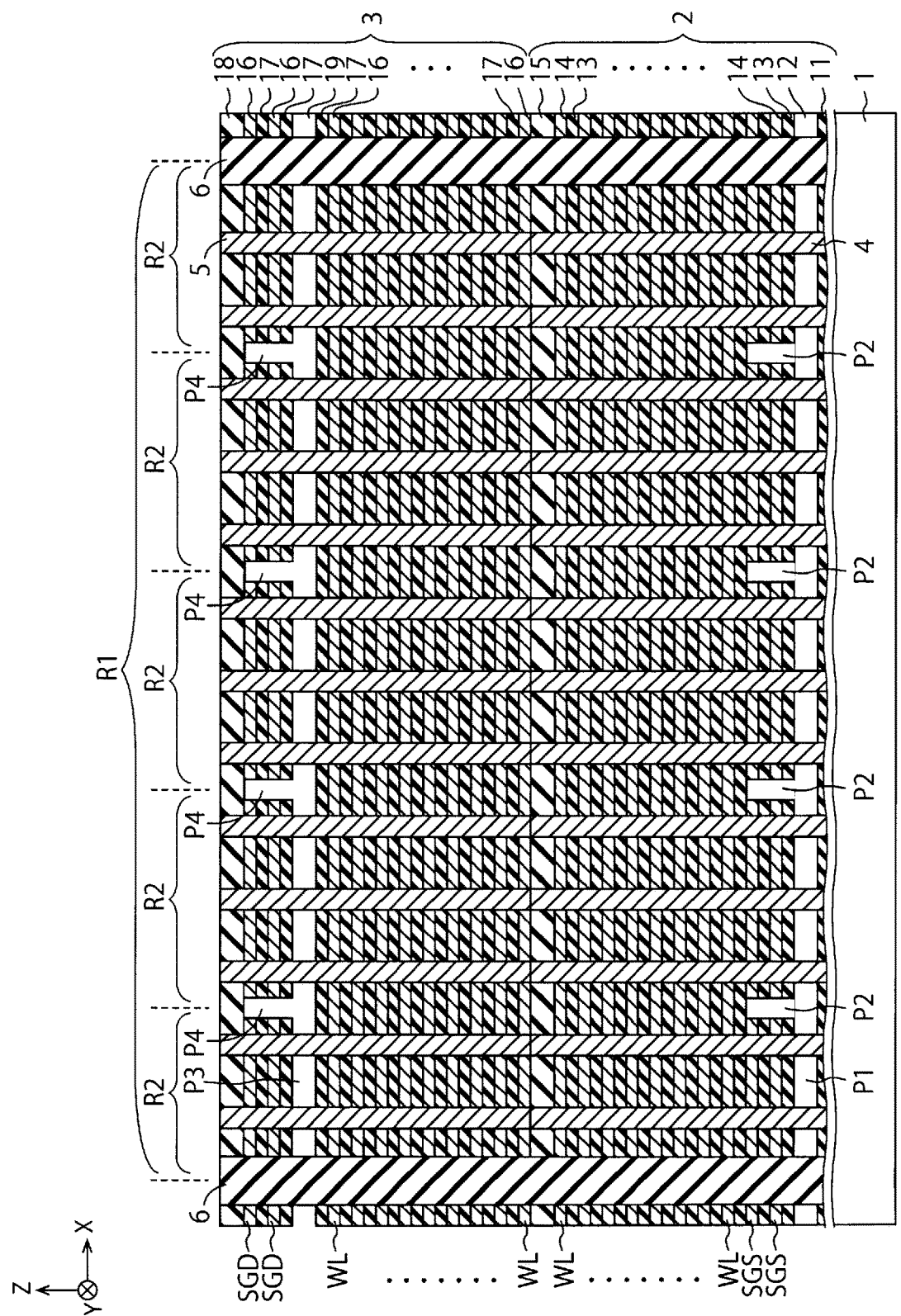
FIG. 23 is a cross-sectional view illustrating a structure of a semiconductor device according to a second embodiment.

FIG. 23 is a cross-sectional view illustrating a structure of a semiconductor device according to the second embodiment.

The semiconductor device according to at least one embodiment has a structure in which the embedded insulating films 7 of the semiconductor device according to the first embodiment are substituted with an air gap 19. The air gap 19 includes a portion P3 and a plurality of portions P4. The air gap 19 is an example of a second gap portion, the portion P3 is an example of a third portion, and the portions P4 are an example of fourth portions.

The upper stacked film 3 according to at least one embodiment includes the air gap 19. Between the embedded insulating films 6, the portion P3 in the air gap 19 is provided between the insulating layer 17 on the word lines WL and the insulating layer 17 under the drain-side selection lines SGD. The portion P3 extends in the X and Y directions. The plurality of portions P4 in the air gap 19 are connected to the portion P3 and are provided in the electrode layers 16 corresponding to the drain-side selection lines SGD. These portions P4 are arranged in the Z direction of the portion P3, extend in the Z and Y directions, and are adjacent to each other in the X direction. The upper portion (upper surface) of the portion P4 is in contact with the lower surface of the interlayer insulating film 18, and the side portion (side surface) of the portion P4 is in contact with the side surfaces of the drain-side selection lines SGD and the side surfaces of the insulating layers 17 formed alternately with the drain-side selection lines SGD.

In FIG. 23, the portion P3 is formed between the uppermost layer of the electrode layers 16 corresponding to the word lines WL and the lowermost layer of the electrode layers 16 corresponding to the drain-side selection line SGD. The portions P4 penetrate the electrode layers 16 corresponding to the drain-side selection lines SGD in the Z direction, extend in the Y direction, and divide the electrode layers 16 corresponding to the drain-side selection lines SGD in the X direction.

In addition, the air gaps 12 and 19 may be also embedded with the insulating films (for example, the embedded insulating films 6). The insulating films in the air gaps 12 and 19 are examples of third and fourth insulating films, respectively. The insulating films in the portions P1, P2, P3, and P4 are examples of first, second, third, and fourth portions, respectively.

Figure 24A:
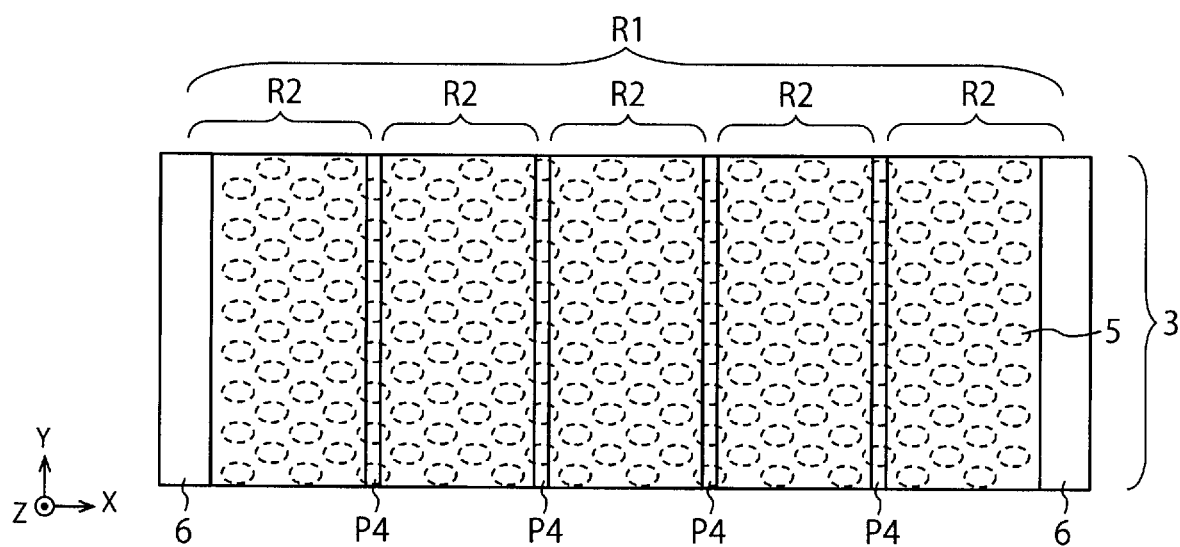
FIGS. 24A and 24B are plan views illustrating the structure of the semiconductor device according to the second embodiment.
Figure 24B:
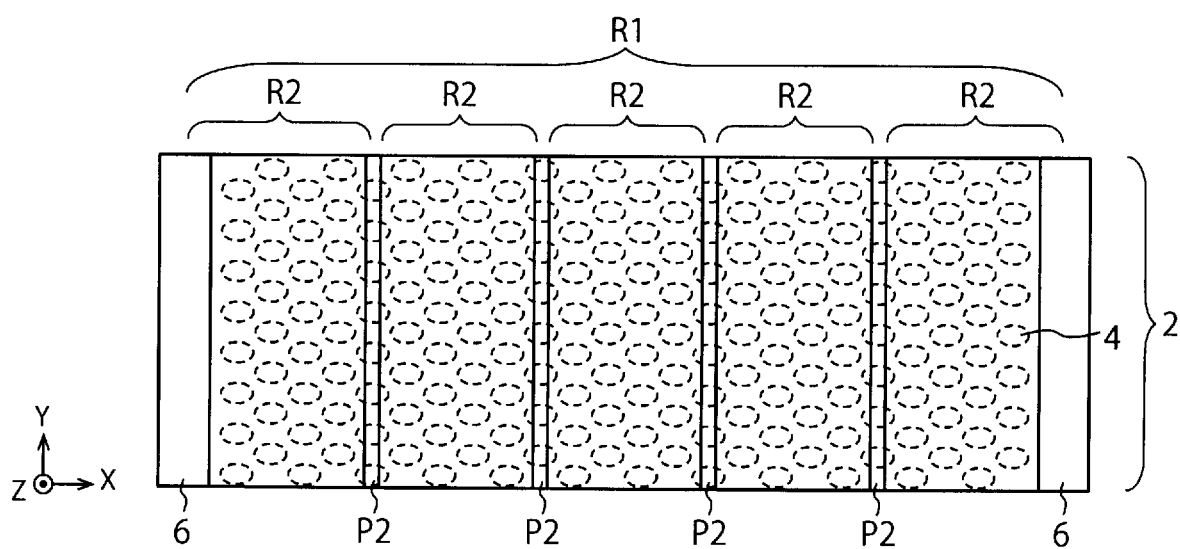

FIGS. 24A and 24B are plan views illustrating the structure of the semiconductor device according to the second embodiment.

FIG. 24A illustrates the upper stacked film 3, the upper columnar portions 5, the embedded insulating films 6, and the portions P4. FIG. 24A illustrates a structure in which the embedded insulating films 7 of FIG. 3A are substituted with the portions P4. FIG. 24B illustrates the lower stacked film 2, the lower columnar portions 4, the embedded insulating films 6, and the portions P2. FIG. 24B illustrates the same structure as in FIG. 3B. FIGS. 24A and 24B further illustrate the regions R1 and R2.

Figure 25A:
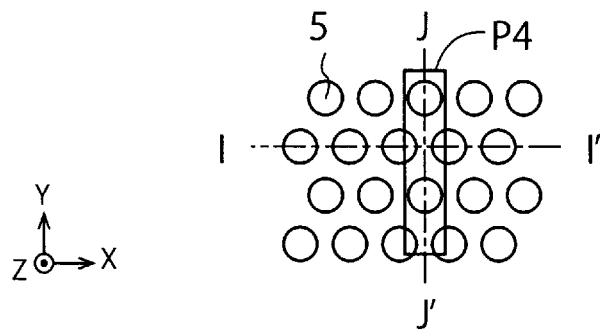
FIGS. 25A to 25C are a plan view and cross-sectional views illustrating the structure of the semiconductor device according to the second embodiment.
Figure 25B:
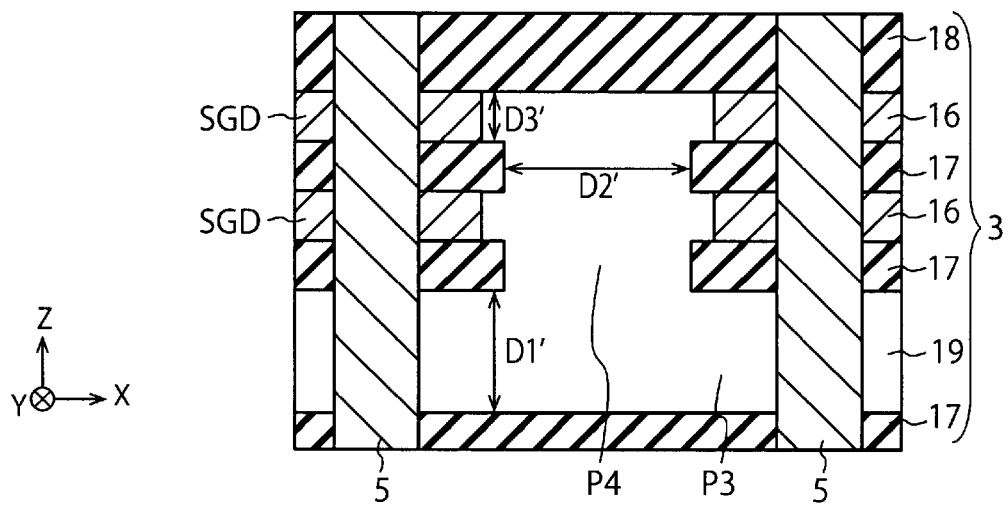
Figure 25C:
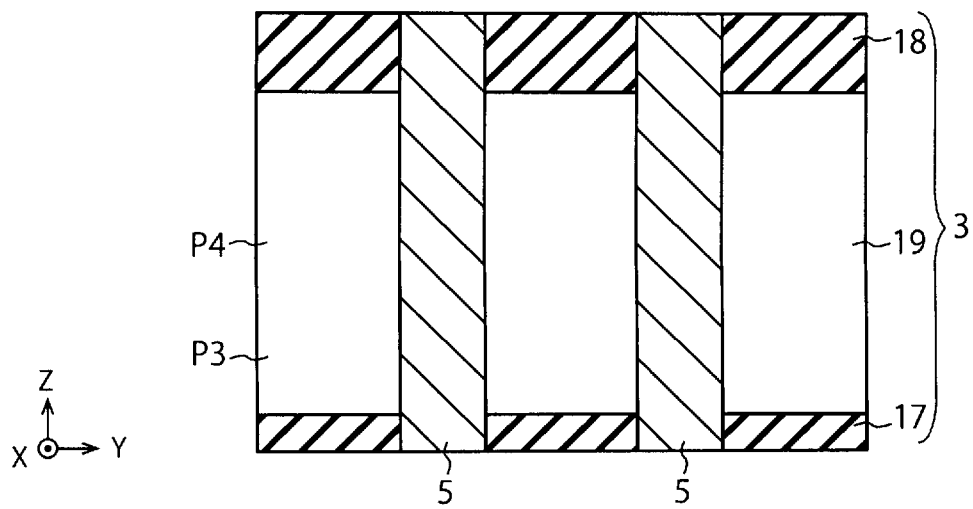

FIGS. 25A to 25C are a plan view and cross-sectional views illustrating the structure of the semiconductor device according to the second embodiment.

FIG. 25A is a plan view illustrating the layout of the upper columnar portions 5 and the portions P4. FIG. 25B is an XZ cross-sectional view taken along the line I-I' of FIG. 25A. FIG. 25C is a YZ cross-sectional view taken along the line J-J' of FIG. 25A. FIGS. 25B and 25C illustrate the cross sections of the upper stacked film 3 near the air gap 19.

FIG. 25B illustrates a width D1' of the portion P3 in the Z direction, a width D2' of the portion P3 in the X direction, and a distance D3' between the insulating layers 17 adjacent to each other in the Z direction (or between the insulating layer 17 and the interlayer insulating film 18. The same is applied below). Since the electrode layers 16 and the block insulating films 36 are formed between the insulating layers 17 (FIG. 2), the distance D3' becomes larger than the width of each of the electrode layers 16 in the Z direction (the thickness of each of the electrode layers 16). According to at least one embodiment, the width D1' is set to be larger than the distance D3' (D1'>D3'), and more specifically, is set to be two or more times of the distance D3' (D1'≥2×D3'). Further, according to at least one embodiment, the width D2' is set to be larger than the distance D3' (D2'>D3'), and more specifically, is set to be two or more times of the distance D3' (D2'≥2×D3').

According to at least one embodiment, the widths D2' of the portions P4 vary depending on the locations (heights). Specifically, the width between the side surfaces of the electrode layers 16 is larger than the width between the side surfaces of the insulating layers 17. The width D2' illustrated in FIG. 25B is the width between the side surfaces of the insulating layers 17. According to at least one embodiment, the width between the side surfaces of the electrode layers 16 and the width between the side surfaces of the insulating layers 17 are two or more times of the distance D3'.

In addition, the relationships of the width D1', the width D2', and the distance D3' described above are satisfied when the insulating films (for example, the embedded insulating films 6) are embedded in the air gap 19. The width D1' indicates the width of the insulating film in the portion P3 in the Z direction. The width D2' indicates the width of the insulating film in each of the portions P4 in the X direction. The distance D3' indicates a distance between the insulating layers 17 adjacent to each other in the Z direction. The above relational expressions "D1'>D3'", "D2'>D3'", "D1'≥2×D3'", and "D2'≥2×D3'" are satisfied when the insulating films are embedded in the air gap 19.

Figure 26:
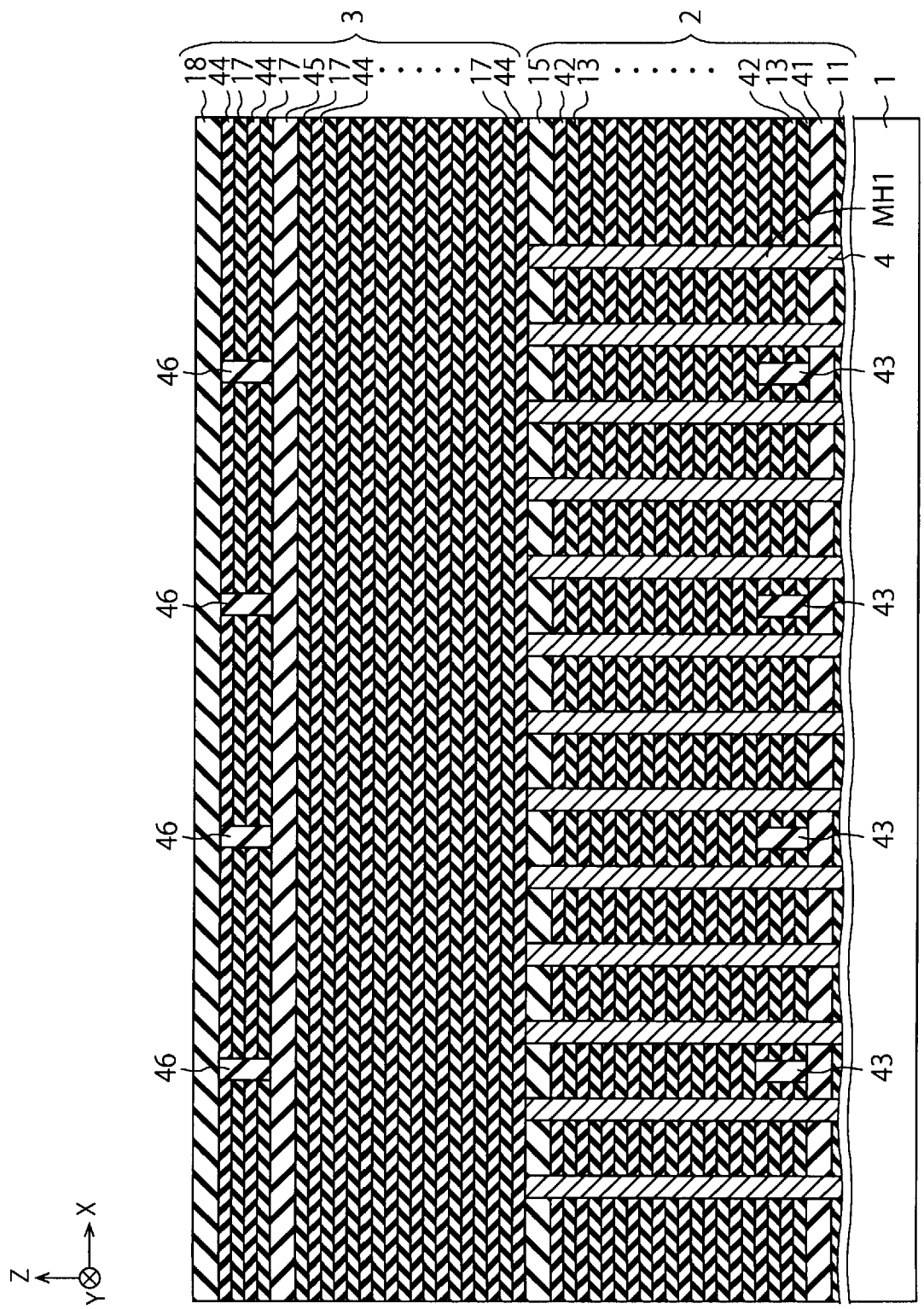
FIG. 26 is a cross-sectional view illustrating the method of manufacturing the semiconductor device according to the second embodiment (1/2).
Figure 27:
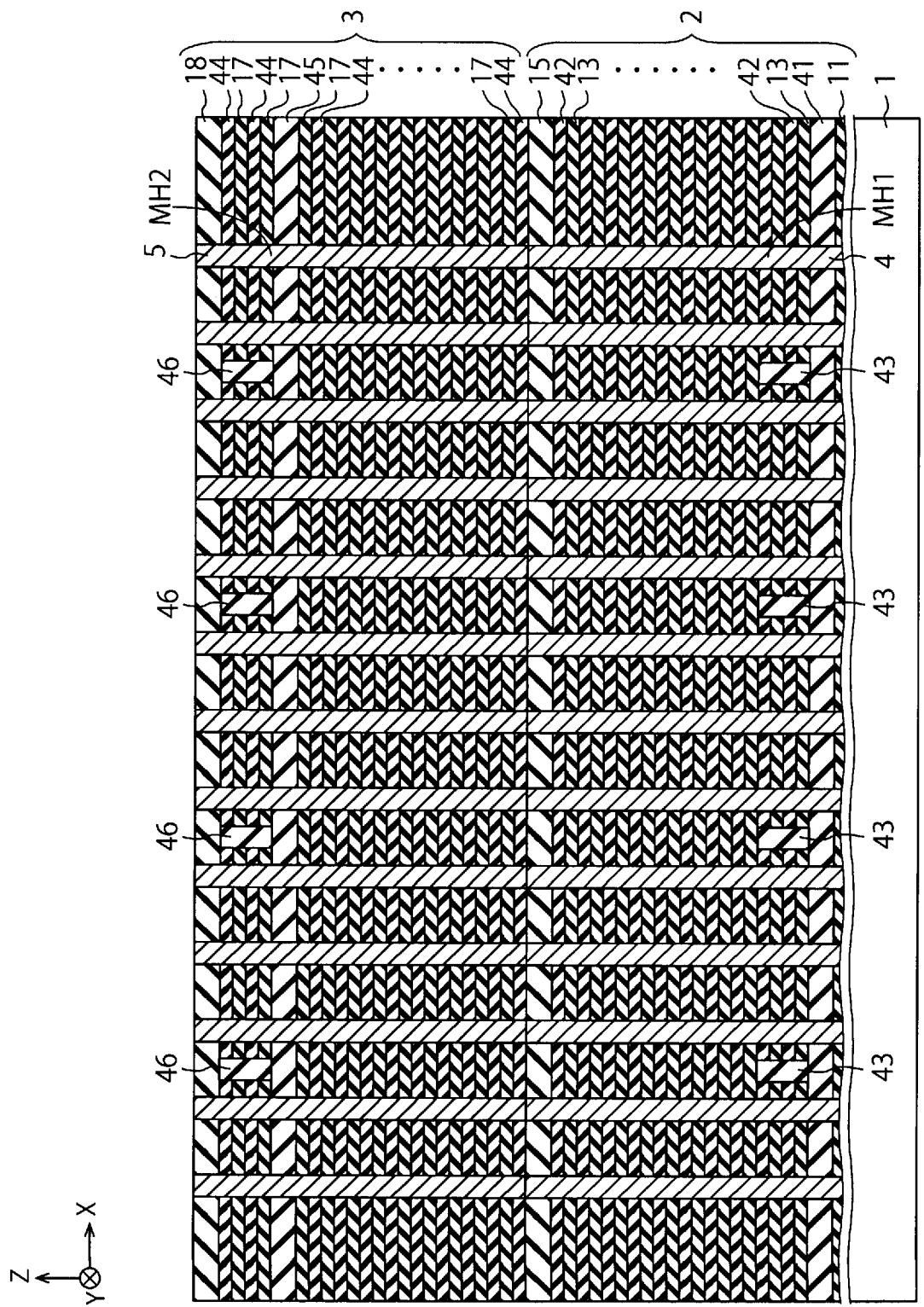
FIG. 27 is a cross-sectional view illustrating the method of manufacturing the semiconductor device according to the second embodiment (2/2).

FIGS. 26 and 27 are cross-sectional views illustrating the method of manufacturing the semiconductor device according to the second embodiment. FIG. 26 corresponds to FIG. 7, and FIG. 27 corresponds to FIG. 8. Hereinafter, differences between FIGS. 7 and 8 and FIGS. 26 and 27 are mainly described, and the common points thereof are appropriately omitted.

First, the steps illustrated in FIGS. 5 and 6 are performed. Next, the plurality of sacrifice layers 44 and the plurality of insulating layers 17 are alternately formed on the interlayer insulating film 15 and the lower columnar portions 4, and a sacrifice layer 45 is formed on the sacrifice layers 44 and the insulating layers 17 (FIG. 26). The sacrifice layer 45 is used for forming the portion P3 of the air gap 19. The sacrifice layer 45 is, for example, an SiN film. The sacrifice layer 45 is an example of a third film.

Next, the plurality of sacrifice layers 44 and the plurality of insulating layers 17 are alternately formed on the sacrifice layer 45, and a plurality of sacrifice layers 46 are formed in the sacrifice layers 44 and the insulating layers 17 (FIG. 26). The sacrifice layers 46 are used in order to form the portions P4 of the air gap 19. The sacrifice layers 46 are, for example, SiN films. The sacrifice layers 46 are an example of a fourth film.

Next, the interlayer insulating film 18 is formed on the sacrifice layers 44, the insulating layers 17, and the sacrifice layers 46 (FIG. 26). In this manner, the upper stacked film 3 is formed on the lower stacked film 2. Here, the upper stacked film 3 illustrated in FIG. 26 includes the sacrifice layers 44, 45, and 46 instead of the electrode layers 16, the portion P3, and the portions P4.

Next, by lithography and RIE, the plurality of upper memory holes MH2 are formed in the upper stacked film 3, and the plurality of upper columnar portions 5 are formed in the upper memory holes MH2 (FIG. 27). In this manner, the upper columnar portions 5 are formed on the corresponding lower columnar portions 4.

Next, the steps illustrated in FIGS. 9 to 12 are performed. At this point, the sacrifice layers 45 and 46 are removed in the same manner as the sacrifice layers 41 and 43, respectively, and the portions P3 and P4 of the air gap 19 are formed in the same manner as the portions P1 and P2 of the air gap 12, respectively. In addition, the electrode layers 16 are formed in the same manner as the electrode layers 14, and the block insulating films 36, the barrier metal layer 16a, and the electrode material layer 16b are formed in the same manner as the block insulating films 26, the barrier metal layer 14a, and the electrode material layer 14b, respectively. In this manner, the semiconductor device of at least one embodiment is manufactured.

As above, the semiconductor device according to at least one embodiment includes the air gap 19 including the portion P3 provided between the insulating layers 17 and the plurality of portions P4 provided in the electrode layers 16 in the +Z direction of the portion P3. Therefore, according to at least one embodiment, the electrode layers 16 corresponding to the drain-side selection lines SGD can be easily separated from each other.

The contents described with reference to FIGS. 13A to 22B may be applied to the upper stacked film 3 according to at least one embodiment. In order to apply the corresponding content to at least one embodiment, the lower stacked film 2, the lower columnar portions 4, the electrode layers 14, insulating layer 15, the air gap 12, the portion P1, the portions P2, the block insulating films 26, the sacrifice layer 41, the sacrifice layers 42, the sacrifice layers 43, and the like may be replaced with the upper stacked film 3, the upper columnar portions 5, the electrode layers 16, the insulating layers 17, the air gap 19, the portion P3, the portions P4, the block insulating films 36, the sacrifice layer 45, the sacrifice layers 44, the sacrifice layers 46, and the like, respectively. Further, the width D1, the width D2, the distance D3, and the like may be replaced with the width D1', the width D2', the distance D3', and the like, respectively.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate;
a stacked film including a plurality of first electrode layers disposed over the substrate, the first electrode layers separated from each other in a first direction, and including a plurality of second electrode layers disposed over the first electrode layers and separated from each other in the first direction; and
a first insulating film and a second insulating film:
that penetrate the plurality of first electrode layers and the plurality of second electrode layers in the first direction,
extend in a second direction intersecting to the first direction, and
divide the plurality of first electrode layers and the plurality of second electrode layers in a third direction, the third direction intersecting the first direction,
wherein the stacked film further includes a first gap portion including a first portion, the first portion disposed between the substrate and a lowermost layer of the plurality of first electrode layers, and includes a second portion connected to the first portion, the second portion penetrating the plurality of first electrode layers in the first direction, the second portion extending in the second direction, and dividing the plurality of first electrode layers in the third direction, between the first insulating film and the second insulating film.

2. The semiconductor device according to claim 1, wherein the first insulating film and the second insulating film are adjacent to each other in the third direction.

3. The semiconductor device according to claim 1, wherein the first gap portion includes a plurality of second portions adjacent to each other in the third direction, as the second portion.

4. The semiconductor device according to claim 1, wherein the plurality of first electrode layers are disposed alternately with the plurality of insulating layers, and a width of the second portion in the third direction is at least two times a distance between insulating layers adjacent to each other in the first direction.

5. The semiconductor device according to claim 1, wherein the plurality of first electrode layers and the plurality of insulating layers are alternately disposed, and a width of the first portion in the first direction is at least two times a distance between the insulating layers adjacent to each other in the first direction.

6. The semiconductor device according to claim 1, wherein an upper portion of the second portion is in contact with a lower surface of an insulating layer disposed between the first electrode layer and the second electrode layer, and a side portion of the second portion is in contact with a side surface of an insulating layer disposed between a side surface of the first electrode layer and the first electrode layer.

7. The semiconductor device according to claim 1, further comprising:
a columnar portion disposed in the plurality of first electrode layers and the plurality of second electrode layers, the columnar portion including a charge storage layer and a semiconductor layer.

8. The semiconductor device according to claim 1, wherein the stacked film between the first insulating film and the second insulating film corresponds to one finger of a memory, and the second portion separates the one finger into a plurality of pages.

9. The semiconductor device according to claim 1, wherein the stacked film is further disposed over the second electrode layer and includes a plurality of third electrode layers separated from each other in the first direction, and the first insulating film and the second insulating film penetrate the plurality of first electrode layers, the plurality of second electrode layers, and the plurality of third electrode layers in the first direction, the first insulating film and the second insulating film extend in the second direction, and divide the plurality of first electrode layers, the plurality of second electrode layers, and the plurality of third electrode layers in the third direction.

10. The semiconductor device according to claim 9, wherein the first electrode layer is a source-side selection line, the second electrode layer is a word line, and the third electrode layer is a drain-side selection line.

11. The semiconductor device according to claim 9, wherein the stacked film further includes a second gap portion and a fourth portion, the second gap portion including the fourth portion and a third portion disposed between an uppermost layer of the plurality of second electrode layers and a lowermost layer of the plurality of third electrode layers, the fourth portion connected to the third portion, penetrating the plurality of third electrode layers in the first direction, extending in the second direction, and dividing the plurality of third electrode layers in the third direction, between the first insulating film and the second insulating film.

12. A semiconductor device comprising:
a substrate;
a stacked film including a plurality of first electrode layers disposed over the substrate, the first electrode layers separated from each other in a first direction and including a plurality of second electrode layers disposed over the first electrode layers and separated from each other in the first direction, and a first insulating film and a second insulating film:
that penetrate the plurality of first electrode layers and the plurality of second electrode layers in the first direction,
extend in a second direction intersecting the first direction, and
divide the plurality of first electrode layers and the plurality of second electrode layers in a third direction, the third direction intersecting the first direction, wherein the stacked film further includes a third insulating film including a first portion, the first portion disposed between the substrate and a lowermost layer of the plurality of first electrode layers, and includes a second portion connected to the first portion, the second portion penetrating the plurality of first electrode layers in the first direction, the second portion extending in the second direction, and dividing the plurality of first electrode layers in the third direction, between the first insulating film and the second insulating film.

13. The semiconductor device according to claim 12, wherein the plurality of first electrode layers are disposed alternately with the plurality of insulating layers, and
a width of the second portion in the third direction is at least two times of a distance between insulating layers adjacent to each other in the first direction.

14. The semiconductor device according to claim 12, wherein the plurality of first electrode layers are disposed alternately with a plurality of insulating layers, and
a width of the first portion in the first direction is at least two times of a distance between the insulating layers adjacent to each other in the first direction.

15. The semiconductor device according to claim 12, wherein the stacked film further includes a plurality of third electrode layers disposed over the second electrode layer and separated from each other in the first direction, and wherein the first insulating film and the second insulating film:
penetrate the plurality of first electrode layers, the plurality of second electrode layers, and the plurality of third electrode layers in the first direction,
extend in the second direction, and
divide the plurality of first electrode layers, the plurality of second electrode layers, and the plurality of third electrode layers in the third direction.

16. The semiconductor device according to claim 15, wherein the stacked film further includes a fourth insulating film and a fourth portion, the fourth insulating film including a third portion disposed between an uppermost layer of the plurality of second electrode layers and a lowermost layer of the plurality of third electrode layers, the fourth portion connected to the third portion, penetrating the plurality of third electrode layers in the first direction, extending in the second direction, and dividing the plurality of third electrode layers in the third direction, between the first insulating film and the second insulating film.

* * * * *